(12) United States Patent
Pierce et al.

(10) Patent No.: US 7,804,019 B2
(45) Date of Patent: Sep. 28, 2010

(54) METHODS OF DEPOSITING EPITAXIAL THERMOELECTRIC FILMS HAVING REDUCED CRACK AND/OR SURFACE DEFECT DENSITIES AND RELATED DEVICES

(75) Inventors: Jonathan Pierce, Piscataway, NJ (US); Robert P. Vaudo, Cary, NC (US)

(73) Assignee: Nextreme Thermal Solutions, Inc., Durham, NC (US)

( * ) Notice: Subject to any disclaimer, the term of this patent is extended or adjusted under 35 U.S.C. 154(b) by 9 days.

(21) Appl. No.: 12/024,475

(22) Filed: Feb. 1, 2008

(65) Prior Publication Data
US 2008/0185030 A1    Aug. 7, 2008

Related U.S. Application Data

(60) Provisional application No. 60/887,964, filed on Feb. 2, 2007.

(51) Int. Cl.
*H01L 35/28* (2006.01)
*H01L 35/34* (2006.01)
*H01L 37/00* (2006.01)

(52) U.S. Cl. .................. 136/200; 136/238; 136/240; 117/953; 117/954; 117/88; 117/89; 117/90; 117/91; 117/92; 117/93; 117/101

(58) Field of Classification Search ............... 136/200, 136/238, 240; 117/953, 954, 88–93, 101
See application file for complete search history.

(56) References Cited

U.S. PATENT DOCUMENTS

| 4,987,472 A | * | 1/1991 | Endo et al. ................. 148/33.4 |
| 6,060,656 A | | 5/2000 | Dresselhaus et al. |
| 6,815,244 B2 | * | 11/2004 | Bottner et al. ................. 438/54 |

FOREIGN PATENT DOCUMENTS

| EP | 0 382 036 A2 | 8/1990 |
| EP | 0 382 036 A3 | 8/1990 |
| EP | 0 437 654 A1 | 7/1991 |
| WO | WO 98/44562 | 10/1998 |

OTHER PUBLICATIONS

Ryan et al., "Electrochemical deposition of semiconductors for thermoelectric devices", Jet propulsion laboratory, 2001.*

(Continued)

*Primary Examiner*—Jennifer K Michener
*Assistant Examiner*—Matthew T Martin
(74) *Attorney, Agent, or Firm*—Myers Bigel Sibley & Sajovec, P.A.

(57) ABSTRACT

A substrate is provided including a growth surface that is offcut relative to a plane defined by a crystallographic orientation of the substrate at an offcut angle of about 5 degrees to about 45 degrees. A thermoelectric film is epitaxially grown on the growth surface. A crystallographic orientation of the thermoelectric film may be tilted about 5 degrees to about 30 degrees relative to the growth surface. The growth surface of the substrate may also be patterned to define a plurality of mesas protruding therefrom prior to epitaxial growth of the thermoelectric film. Related methods and thermoelectric devices are also discussed.

42 Claims, 11 Drawing Sheets

OTHER PUBLICATIONS

Wu et al., "Crack-free GaN/Si (111) epitaxial layers grown with InAlGaN allow as compliant interlayer by meralorganic chemical vapor deposition", Journal of Crystal Growth, 2005.*

Jung et al., "Material characteristics of metalorganic chemical vapor deposition of $Bi_2Te_3$ films on GaAs substrates", Journal of Crystal Growth, vol. 290:2, pp. 441-445 (May 1, 2006) XP025157273.

Kim et al., "Structural Characteristics of $Bi_2Te_3$ and $Sb_2Te_3$ films on (001) GaAs Substrates grown by MOCVD", IEEE, PI, 25$^{th}$ International Conference on Thermoelectrics 2006, ICT '06, pp. 411-413 (Aug. 1, 2006) XP031062461.

Peranio et al., "Structural and thermoelectric properties of expitaxially grown $Bi_2Te_3$ thin films and superlattices", Journal of Applied Physics, vol. 100:11, pp. 114306-1 thru 114306-10 (Dec. 6, 2006). XP012089191.

Venkatasubramanian et al., "Low-temperature organometallic epitaxy and its application to superlattice structures in thermoelectrics", Applied Physics Letters, vol. 75:8, pp. 1104-1106 (Aug. 23, 1999) XP012024638.

Invitation To Pay Additional Fees And, Where Applicable, Protest Fee (8 pages) corresponding to International Application No. PCT/US2008/001395; Mailing Date: Mar. 30, 2009.

Kim et al. "MOCVD of Bi2Te3 and Sb2T33 on GaAs Substrates for Thin-Film Thermoelectric Applications", *J. Nanosci. Nanotechnol.* 6(11):3325-3328 (2006).

Jung et al "Material characteristics of metalorganic chemical vapor deposition of Bi2Te3 films on GaAs substrates", *J. of Crystal Growth* 290:441-445 (2006).

Venkatasubramanian et al. "Low temperature organometallic epitaxy and its application to superlattice structures in thermoelectrics", *Appl. Phys. Letter.* 75(8):1104-1106 (1999).

Venkatasubramanian "MOCVD of Bi2Te3, Sb2Te3 and their superlattice structures for thin-film thermoelectric applications", *J. of Crystal Growth* 170:817-821 (1997).

Xie et al. "Surface Morphology of GaN: Flat versus Vicinal Surfaces", *F99W3.29* 6 pages.

* cited by examiner

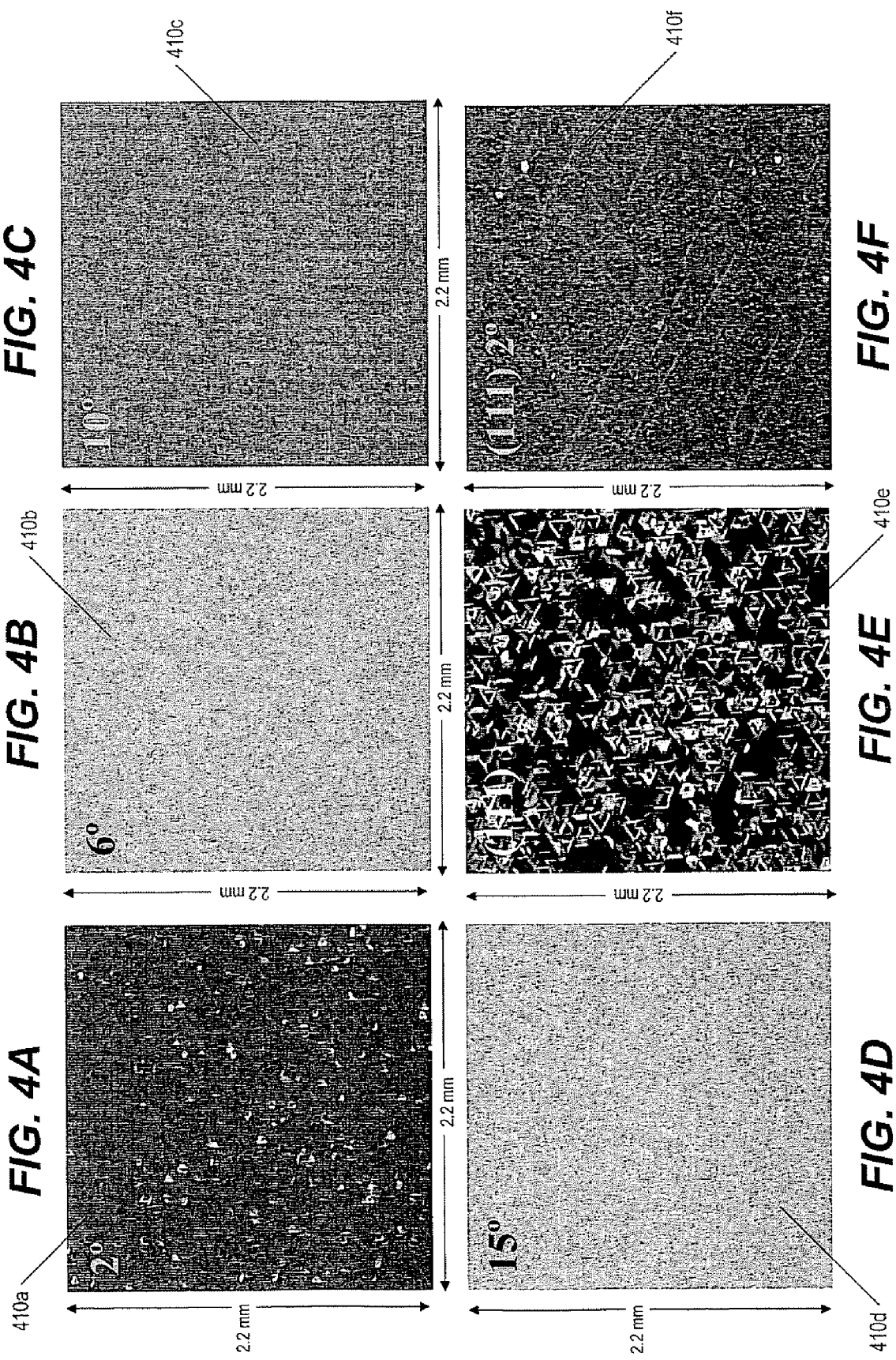

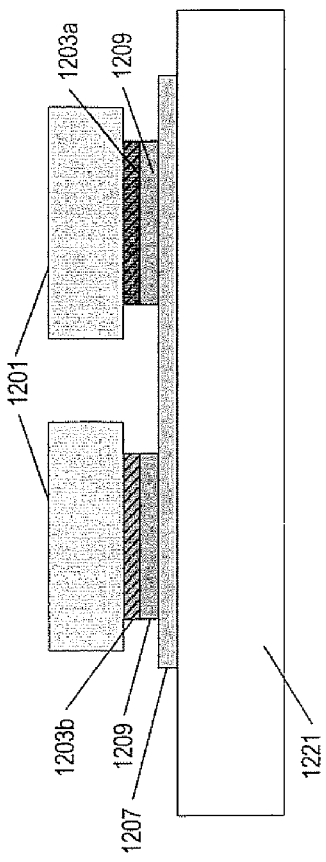
FIG. 12A
FIG. 12B
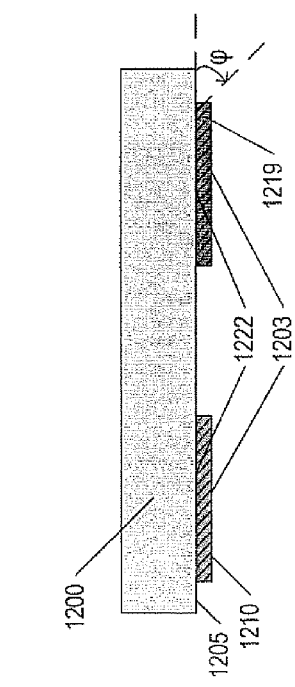
FIG. 12C
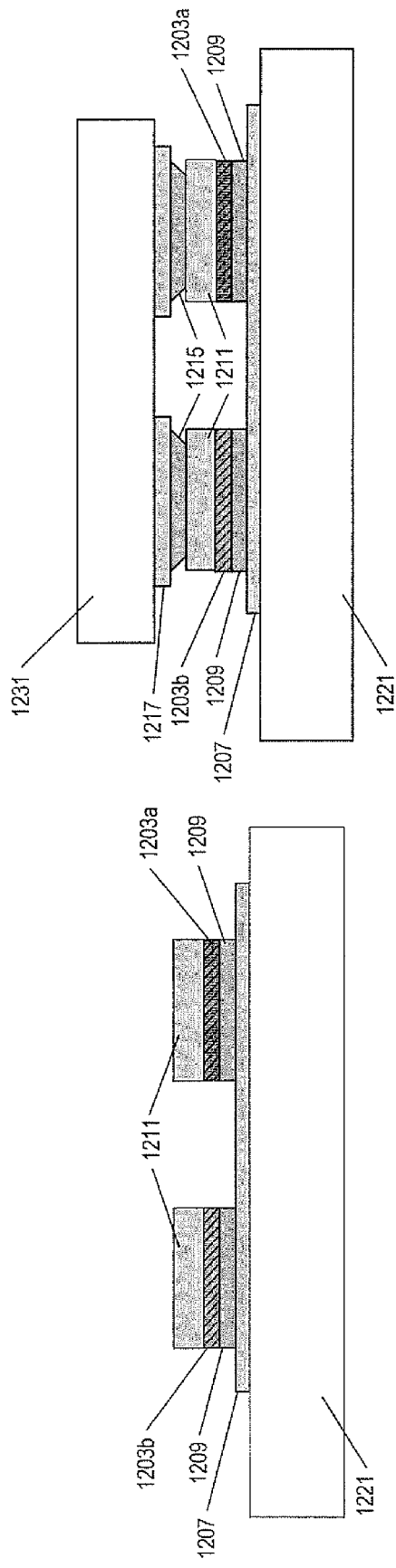
FIG. 12D

US 7,804,019 B2

METHODS OF DEPOSITING EPITAXIAL THERMOELECTRIC FILMS HAVING REDUCED CRACK AND/OR SURFACE DEFECT DENSITIES AND RELATED DEVICES

RELATED APPLICATION

The present application claims the benefit of priority from U.S. Provisional Application No. 60/887,964 entitled "Methods Of Depositing Epitaxial Films With Reduced Crack And/Or Surface Defect Density On GaAs With Improved Deposition Rate" filed Feb. 2, 2007, the disclosure of which is hereby incorporated by reference herein in its entirety.

FIELD OF THE INVENTION

The present invention relates to methods of fabricating thin film thermoelectric materials and related thermoelectric devices.

BACKGROUND

Thermoelectric materials may be used to provide cooling and/or power generation according to the Peltier effect. Thermoelectric materials are discussed, for example, in the reference by Venkatasubramanian et al. entitled "*Phonon-Blocking Electron-Transmitting Structures*" (18$^{th}$ International Conference On Thermoelectrics, 1999), the disclosure of which is hereby incorporated herein in its entirety by reference.

Application of solid state thermoelectric cooling may be expected to improve the performance of electronics and sensors such as, for example, RF receiver front-ends, infrared (IR) imagers, ultra-sensitive magnetic signature sensors, and/or superconducting electronics.

The performance of a thermoelectric device may be a function of the figure(s)-of-merit (ZT) of the thermoelectric material(s) used in the device, with the figure-of-merit being given by:

$$ZT=(\alpha^2 T\sigma/K_T), \quad \text{(equation 1)}$$

where $\alpha$, T, $\sigma$, $K_T$ are the Seebeck coefficient, absolute temperature, electrical conductivity, and total thermal conductivity, respectively. The material-coefficient Z can be expressed in terms of lattice thermal conductivity ($K_L$) electronic thermal conductivity ($K_e$) and carrier mobility ($\mu$), for a given carrier density ($\rho$) and the corresponding $\alpha$, yielding equation (2) below:

$$Z=\alpha^2\sigma/(K_L+K_e)=\alpha^2/[K_L/(\mu\rho q)+L_0)], \quad \text{(equation 2)}$$

where, $L_0$ is the Lorenz number (approximately $1.5\times10^{-8}$ $V^2/K^2$ in non-degenerate semiconductors). State-of-the-art thermoelectric devices may use alloys, such as p-$Bi_xSb_{2-x}$ $Te_{3-y}Se_y$ (x·0.5, y·0.12) and n-$Bi_2(Se_yTe_{1-y})_3$ (y·0.05) for the 200 degree K to 400 degree K temperature range. For certain alloys, $K_L$ may be reduced more strongly than $\mu$ leading to enhanced ZT.

In addition, thin-film thermoelectric materials have been developed, For example, bismuth telluride ($Bi_2Te_3$) and/or antimony telluride ($Sb_2Te_3$)-based epitaxial films grown on gallium arsenide (GaAs) substrates may be used in the fabrication of thin-film thermoelectrics. However, the growth morphology of these films may be plagued by cracks and surface defects in the film. For example, a thermoelectric film grown on a 2° offcut GaAs substrate may have a crack density of about 5-20 cracks per millimeter (mm), and in some instances, greater than 10 cracks/mm. These cracks and defects may lead to reliability problems and/or complications in subsequent film processing, which may compromise one or more benefits that may be derived from the films.

Accordingly, there continues to exist a need in the art for improved thermoelectric device fabrication methods and strictures.

SUMMARY

According to some embodiments of the present invention, a method of fabricating a thermoelectric device includes providing a substrate including a growth surface that is offcut relative to a plane defined by a crystallographic orientation of the substrate at an offcut angle in a range of about 5 degrees to about 45 degrees. A thermoelectric film is epitaxially grown on the growth surface.

In some embodiments, the plane defined by the crystallographic orientation of the substrate may be a {100} plane, and the growth surface may be a vicinal growth surface that is offcut from the {100} plane toward a <110> direction.

In other embodiments, the offcut angle may be in a range of about 5 degrees to about 30 degrees, and in still other embodiments, in a range of about 10 degrees to about 20 degrees. For example, the offcut angle may be about 15 degrees relative to the {100} plane toward the <110> direction.

In some embodiments, a crystallographic orientation of the thermoelectric film may be tilted at an angle in a range of about 5 degrees to about 30 degrees relative to the growth surface. For example, the crystallographic orientation of the thermoelectric film may be tilted at an angle in a range of about 10 degrees to about 25 degrees. More particularly, in some embodiments, the crystallographic orientation of the thermoelectric film may be tilted at an angle of about 11.5 degrees relative to the growth surface. In other embodiments, the crystallographic orientation of the thermoelectric film may be tilted at an angle in a range of about 18 degrees to about 24 degrees relative to the growth surface. For example, the crystallographic orientation of the thermoelectric film may be tilted at an angle of about 20 degrees relative to the growth surface. A plane defined by the crystallographic orientation of the thermoelectric film may be a (0015) plane.

In other embodiments, the thermoelectric film may be a compound comprising bismuth (Bi), antimony (Sb), lead (Pb), tellurium (Te), and/or selenium (Se).

In other embodiments, the substrate may be gallium arsenide (GaAs), silicon (Si), barium fluoride (BaF), silicon carbide (SiC), gallium nitride (GaN), aluminum nitride (AlN), sapphire, and/or glass.

In some embodiments, the growth surface of the substrate may be patterned to define a plurality of mesas protruding therefrom prior to epitaxially growing the thermoelectric film. In some embodiments, a thermoelectric film seed layer may be epitaxially grown on the growth surface of the substrate prior to patterning the growth surface of the substrate.

In other embodiments, prior to epitaxially growing the thermoelectric film, a mask pattern may be formed on the growth surface of the substrate to expose a plurality of portions thereof and the thermoelectric film may be epitaxially grown on the plurality of exposed portions of the growth surface. In some embodiments, a thermoelectric film seed layer may be epitaxially grown on the growth surface prior to forming the mask pattern thereon.

In some embodiments, at least one intermediate layer may be formed on the growth surface of the substrate prior to epitaxially growing the thermoelectric film thereon. The intermediate layer may include a silicon carbide (SiC) layer, an aluminum nitride (AlN) layer, a gallium arsenide (GaAs) layer, and/or a strained layer superlattice configured to help nucleation and/or accommodate strain between the growth surface and the thermoelectric film. For example, the intermediate layer may be a layer having a lattice constant between that of the substrate and the thermoelectric film, and in some embodiments, may be a graded layer configured to bridge a lattice mismatch between the substrate and the thermoelectric film.

In other embodiments, the thermoelectric film may be epitaxially grown to a thickness in a range of about 5 micrometers ($\mu$m) to about 100 $\mu$m. For example, the thermoelectric film may be grown to a thickness of about 40 $\mu$m or less. The thermoelectric film may have a crack density of less than about 1 crack per millimeter (mm), and in some embodiments, less than about 1 crack per centimeter (cm).

According to further embodiments of the present invention, a method of fabricating a thermoelectric device includes patterning a substrate to define a growth surface having a plurality of mesas protruding therefrom. A thermoelectric film is epitaxially grown on the growth surface.

In some embodiments, the thermoelectric film may be epitaxially grown to include a plurality of mesas protruding from the growth surface. The plurality of mesas of the thermoelectric film may be substantially elliptical or rectangular in plan view.

In some embodiments, the plurality of mesas of the thermoelectric film may be elongated rectangular mesas extending in a direction substantially parallel to at least one crack in the thermoelectric film.

In other embodiments, the plurality of mesas of the thermoelectric film may have a diameter or width of about 200 micrometers ($\mu$m) or less.

In some embodiments, a mesa of the thermoelectric film may have a crack density of less than about 1 crack per millimeter (mm).

In other embodiments, a crystallographic orientation of the thermoelectric film may be tilted at an angle in a range of about 5 degrees to about 30 degrees relative to the growth surface. The plurality of mesas of the thermoelectric film may have a diameter or width of about 400 micrometers ($\mu$m) or less, and in some embodiments, about 300 $\mu$m or less.

In other embodiments, the substrate may be a vicinal growth surface that is offcut relative to a plane defined by a crystallographic orientation of the substrate at an offcut angle in a range of about 5 degrees to about 45 degrees. For example, the plane defined by the crystallographic orientation of the substrate may be a {100} plane, and the vicinal growth surface may be offcut from the {100} plane toward a <110> direction. Also, the offcut angle may be in a range of about 5 degrees to about 30 degrees.

In some embodiments, a thermoelectric film seed layer may be epitaxially grown on the substrate prior to patterning the substrate.

According to still further embodiments of the present invention, a thermoelectric device includes a thermoelectric element including a thermoelectric film. The thermoelectric film has a crystallographic orientation that is tilted at an angle in a range of about 5 degrees to about 30 degrees relative to a surface of the thermoelectric film.

In some embodiments, the crystallographic orientation of the thermoelectric film may be tilted at an angle in a range of about 10 degrees to about 25 degrees relative to a surface of the thermoelectric film. For example, in some embodiments, the crystallographic orientation of the thermoelectric film may be tilted at an angle of about 11.5 degrees relative to the surface of the thermoelectric film. In other embodiments, the crystallographic orientation of the thermoelectric film may be tilted at an angle of about 20 degrees relative to the surface of the thermoelectric film.

In other embodiments, the thermoelectric film may be a compound AB, where component A may be bismuth (Bi), antimony (Sb), and/or lead (Pb), and where component B may be tellurium (Te) and/or selenium (Se).

In some embodiments, the thermoelectric film may have a thickness in a range of about 5 micrometers ($\mu$m) to about 100 $\mu$m. For example, the thermoelectric film may have a thickness of about 40 $\mu$m or less. The thermoelectric film may have a crack density of less than about 1 crack per millimeter (mm).

In other embodiments, the thermoelectric device may further include first and second headers, and a second thermoelectric element including a second thermoelectric film. The second thermoelectric film may have a crystallographic orientation that is tilted at an angle in a range of about 5 degrees to about 30 degrees relative to a surface of the second thermoelectric film. The first and second thermoelectric elements may have different conductivity types. The first and second thermoelectric elements may be electrically coupled in series and are thermally coupled in parallel between the first and second headers.

According to still other embodiments of the present invention, a thermoelectric film includes a thermoelectric material layer having a thickness of less than about 100 micrometers ($\mu$m) and a crack density of less than about 1 crack per millimeter (mm).

In some embodiments, a crystallographic orientation of the thermoelectric material layer may be tilted at an angle in a range of about 5 degrees to about 30 degrees relative to a surface of the thermoelectric material layer. A plane defined by the crystallographic orientation of the thermoelectric material layer may be a (0015) plane.

In other embodiments, the thermoelectric material layer may have a thickness in a range of about 5 micrometers ($\mu$m) to about 100 $\mu$m. The thermoelectric material layer may be a compound comprising bismuth (Bi), antimony (Sb), lead (Pb), tellurium (Te), and/or selenium (Se).

BRIEF DESCRIPTION OF THE DRAWINGS

FIGS. 4A-4F are optical micrographs illustrating n-type thermoelectric films epitaxially grown on gallium arsenide substrates of different crystal orientations including substrates according to some embodiments of the present invention.

FIGS. 12A-12D are cross-sectional view illustrating methods of fabricating thermoelectric devices including thermoelectric films epitaxially grown on substrates according to some embodiments of the present invention.

DETAILED DESCRIPTION

Figure 1:
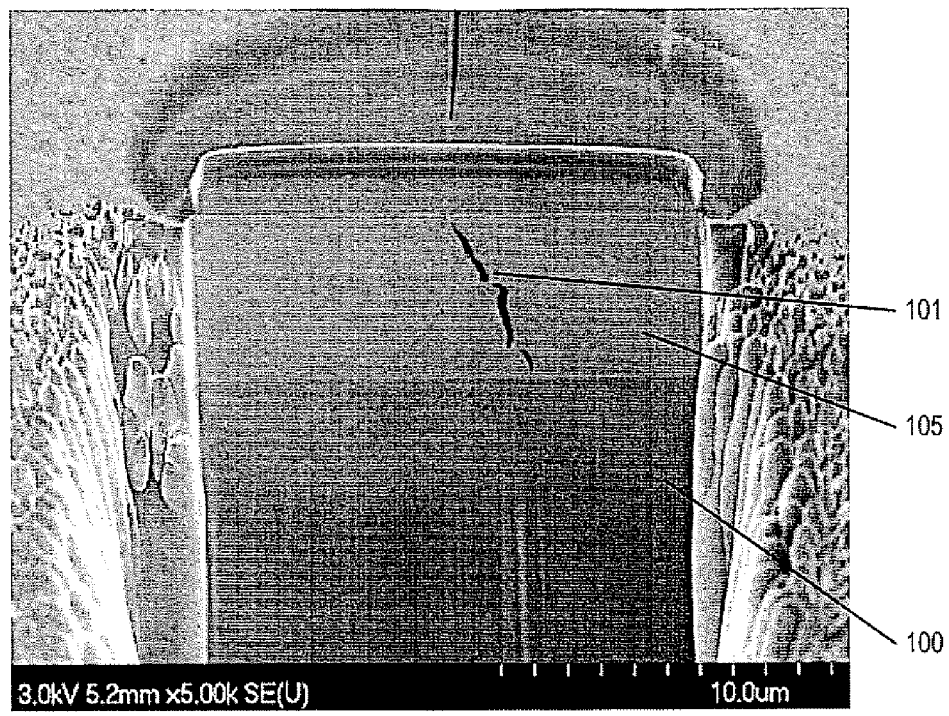
FIG. 1 is a focused ion beam cross-sectional image illustrating an epitaxially grown thermoelectric film.

The present invention is described more fully hereinafter with reference to the accompanying drawings, in which embodiments of the present invention are shown. This invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing, techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein. All publications, patent applications, patents, and other references mentioned herein are incorporated by reference in their entirety.

While some embodiments are described below with reference to metal organic chemical vapor deposition (MOCVD), it is to be understood that other methods of thermoelectric film deposition may also be used in embodiments of the present invention. For instance, molecular beam epitaxy (MBE), thermal or e-beam evaporation, sputtering, vapor phase epitaxy, alternate layer epitaxy, laser ablation, and/or other techniques used for thin film crystal growth may be used.

Crystallographic orientation in thermoelectric films and/or growth substrates according to some embodiments of the present invention is described herein with reference to Miller indices. As used herein, Miller indices in square brackets, such as [100], denote a direction, while Miller indices in angle brackets or chevrons, such as <100>, denote a family of directions that are equivalent due to crystal symmetry. For example, in a cubic system, <100> refers to the [100], [010], [001] directions and/or the negative of any of these directions, noted as the [−100], [010], [00-1] directions. Miller indices in parentheses, such as (100), denote a plane. In a cubic system, the normal to the (100) plane is the direction [100]. Miller indices in curly brackets or braces, such as {100}, denote a family of planes that are equivalent due to crystal symmetry, in a manner similar to the way angle brackets denote a family of directions.

Figure 2:
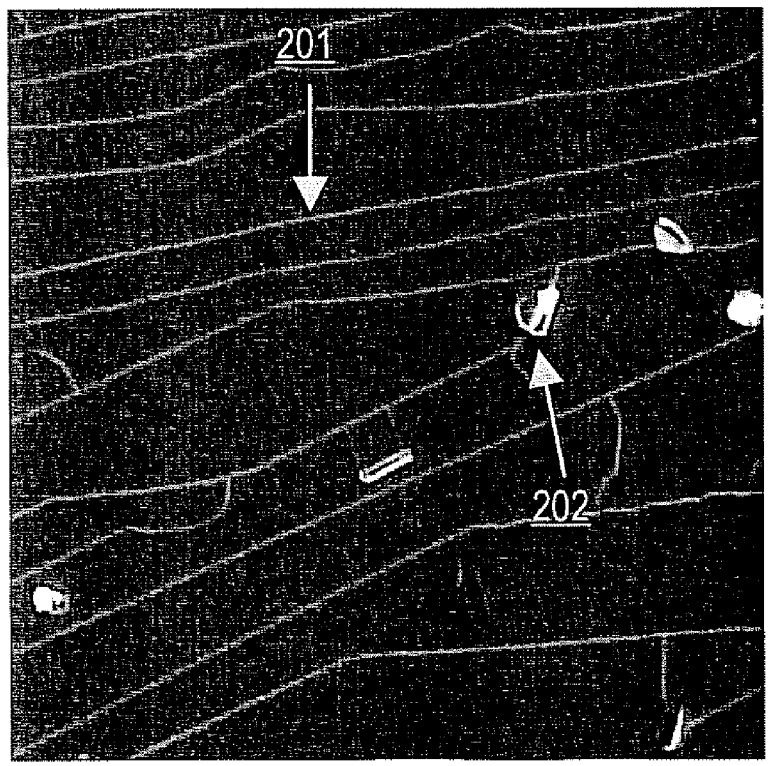
FIG. 2 is an optical micrograph illustrating cracks and surface defects in an epitaxially grown thermoelectric film.

FIGS. 1 and 2 illustrate examples of cracks and surface defects that may occur in epitaxial thin film thermoelectric materials. As shown in cross section in FIG. 1, a crack 101 extends through a bismuth antimony telluride selenium (BiSbTeSe)-based epitaxial film 105 on a gallium arsenide (GaAs) substrate 100. FIG. 2 further illustrates cracks 201 and surface defects 202 in a BiSbTeSe-based epitaxial film 205. Possible explanations for the cracking in the films 105 and/or 205 illustrated in FIGS. 1 and 2 may include poor lattice matching between the GaAs substrate and the BiSbTeSe-based epitaxial films, and/or a coefficient of thermal expansion (CTE) mismatch between the GaAs substrate and the BiSbTeSe-based epitaxial films.

A barium fluoride (BaF) substrate may be a good candidate for BiSbTeSe-based epitaxial films because it may provide good CTE and lattice matching. A silicon (Si) substrate may also be a good candidate for BiSbTeSe-based epitaxial films because they are available at low cost and relatively large sizes. However, sapphire, silicon carbide (SiC), gallium nitride (GaN), aluminum nitride (AlN), glass, and/or other substrates that provide an adequate seed for growth of a thermoelectric film may also be used. Interlayers such as silicon carbide (SiC), aluminum nitride (AlN), GaAs, and/or strained layer superlattices may also be formed on the substrate to help growth nucleation and/or to accommodate strain.

Some embodiments of the present invention consider the effects of two parameters on the density of cracking in thermoelectric films, such as BiSbTeSe-based films, epitaxially grown on a GaAs substrate: (1) GaAs crystal orientation; and (2) patterning of GaAs prior to epitaxy.

Figure 3A:
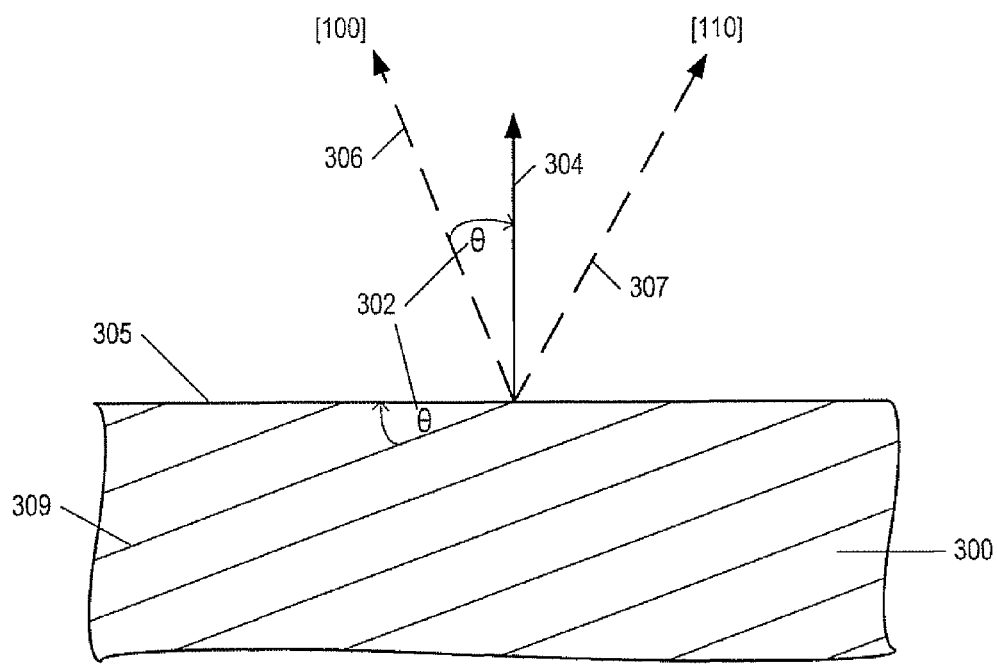
FIGS. 3A-3B are cross-sectional views illustrating methods of fabricating thermoelectric films on offcut substrates according to some embodiments of the present invention.
Figure 3B:
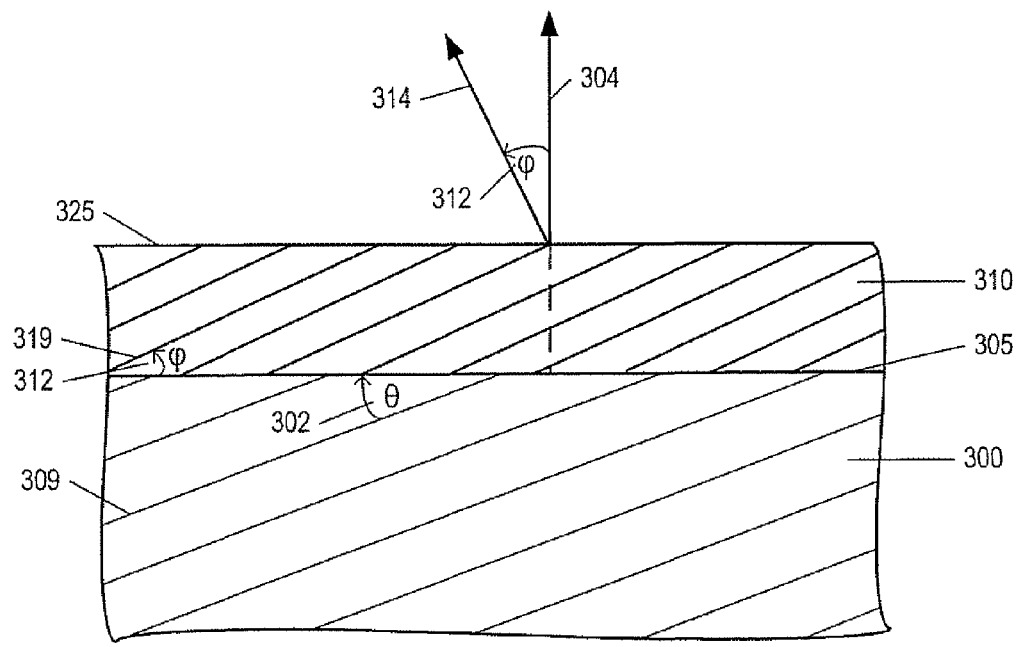

FIGS. 3A and 3B illustrate methods of fabricating a thermoelectric film on a growth substrate according to some embodiments of the present invention. Referring now to FIG. 3A, a substrate 300 is provided including a growth surface 305. For instance, the substrate 300 may be a gallium arsenide (GaAs), silicon (Si), barium fluoride (BaF), sapphire, silicon carbide (SiC), gallium nitride (GaN), aluminum nitride (AlN), and/or glass substrate. The growth surface 305 is offcut relative to a plane defined by the crystallographic orientation (indicated by hatched lines 309) of the substrate 300. As used herein, the term "offcut" refers to a miscut, misorientation, and/or tilt of a substrate surface relative to another surface or plane. For example, where the substrate 300 is a GaAs substrate having a cubic crystal structure, the growth surface 305 may be offcut relative to the crystallographic orientation 309 of the substrate 300 along the (100) plane. Also, as described herein, the direction of a surface or plane is defined by a direction that is normal or perpendicular to the surface or plane. As such, an "offcut" or "vicinal" surface also describes a surface having a normal that is off-axis or tilted relative to the normal of the particular surface or plane. Accordingly, for a GaAs substrate, the normal 304 to the growth surface 305 may be off-axis relative to the direction 306 of the (100) plane, i.e., the [100] direction.

Offcut wafers in accordance with embodiments of the present invention can be produced by different methods. For instance, a long GaAs boule can be oriented and sliced to produce wafer surfaces with an offcut angle relative to the GaAs lattice c-plane. Vicinal GaAs can also be grown on a vicinal template that is removed after deposition of the vicinal GaAs material, to yield a freestanding vicinal GaAs substrate. Other techniques for providing the offcut growth surface 305 are well-known to those of ordinary skill in the art and will not be described further herein.

Still referring to FIG. 3A, the growth surface 305 of the substrate 300 according to some embodiments of the present invention is a vicinal surface offcut from a {100} plane toward a <110> direction at an angle θ (hereinafter referred to as an "offcut angle" 302) in the range of about 5 degrees (°) to about 45 degrees. For example, in some embodiments, the offcut angle 302 of the growth surface 305 relative to the (100) plane may be in the range of about 10 degrees to about 30 degrees. More particularly, the offcut angle 302 may be about 15 degrees toward the <110> direction. Such a growth surface 305 is also referred to herein as a 15° off (100) surface. Accordingly, as shown in FIG. 3A, the normal 304 through the growth surface 305 is tilted off-axis from the [100] direction 306 toward the [110] direction 307 at an offcut angle 302 of about 5° to about 30°. The use of an intentionally offcut growth surface 305 provides atomic step edges and/or kinks (not shown) along the growth surface 305 that serve as preferential nucleation sites for the growth of a thermoelectric layer 310 thereon, as shown in FIG. 3B. The selection of the offcut angle 302 may define the lateral periodicity of the steps at the growth surface 305, as the offcut angle of a vicinal surface may determine the average spacing between steps.

Referring now to FIG. 3B, a thermoelectric (TE) film 310 is epitaxially grown on the growth surface 305 of the substrate 300. The thermoelectric film 310 may be a compound including Group V elements (such as bismuth (Bi) antimony (Sb), and/or lead (Pb)), and Group VI elements (such as tellurium (Te) and/or selenium (Se)). For example, in some embodiments, the thermoelectric film 310 may be an epitaxial film of $Bi_2Te_3$ grown by metal organic chemical vapor deposition (MOCVD) on a GaAs substrate carried out in a reactor at a growth temperature of about 350° C. and a growth pressure of about 350 Torr by the pyrolytic reaction of trimethylbismuth (TMBi) and diisopropyltelluride (DiPTe). Techniques for such epitaxial growth are further described, for example, in the publications by Venkatasubramanian et al. "*MOCVD of $Bi_2Te_3$ and/or $Sb_2Te_3$ and their superlattice structures for thin-film thermoelectric applications*", (Journal of Crystal Growth 170, 1997), and "*Low-temperature organometallic epitaxy and its application to superlattice structures in thermoelectrics*" (Applied Physics Letters Vol. 75, No. 8, 1999), the disclosures of which are hereby incorporated by reference herein in their entireties. The thermoelectric film 310 may include a single alloy layer, multiple layers, and/or graded layers, and may be grown using steady gas flows, alternating flows, pauses, etc. using ones of the above-described Group V and/or Group VI elements.

Still referring to FIG. 3B, due to the offcut of the growth surface 305, the crystallographic direction of the thermoelectric film 310 along the c-axis 314 is not perpendicular to the growth surface 305. More particularly, the c-plane of the thermoelectric film 310 has a crystallographic orientation (indicated by hatched lines 319) that is tilted by about 5 degrees to about 30 degrees relative to the plane defined by the growth surface 305 and/or the plane defined by the surface 325 of the film 310 itself. Thus, as illustrated in FIG. 3B, the c-axis 314 of the thermoelectric film 310 is tilted off-axis from the normal 304 to the growth surface 305 by an angle φ312 in the range of about 5° to about 30°. For example, the angle φ312 may be in the range of about 10° to about 25°, and more specifically, about 18° to about 24°. In some embodiments, the crystallographic orientation 319 of the thermoelectric film 310 may be tilted at an angle φ312 of about 11.5 degrees relative to the plane of the growth surface 305; thus, the c-axis 314 of the film 310 may be about 11.5° off of the normal 304. In other embodiments, the crystallographic orientation 319 may be tilted at an angle φ312 of about 20 degrees relative to the plane of the growth surface 305. Accordingly, the offcut angle 302 of the growth surface 305 may influence the crystallographic tilt angle 312 of the thermoelectric film 310 grown on the growth surface 305. The offcut angle 302 of the growth surface 305 may be greater than the crystallographic tilt angle 312 of the thermoelectric film 310 grown thereon in some embodiments; however, in other embodiments, the offcut angle 302 may be less than or equal to the crystallographic tilt angle 312.

The thermoelectric film 310 may be grown to a thickness of about 5 micrometers (μm) to about 100 μm. For example, in some embodiments, the thermoelectric film 310 may have a thickness of about 40 μm or less. In addition, thermoelectric films epitaxially grown on substrates according to some embodiments of the present invention may have a reduced incidence of cracks and/or surface defects than thermoelectric films grown on conventional substrates, such as substrates having a growth surface that is offcut relative to a {100} plane at an offcut angle of about 2 degrees. For example, in some embodiments, the thermoelectric film 310 may have a crack density of less than about 1 crack per millimeter (mm). As used herein, the terms "crack density" or "cracks/mm" refer to a linear measurement based on the number of cracks in a thermoelectric film that intersect with a line of a predetermined length drawn across the thermoelectric film, divided by the length of the line.

Although described in FIGS. 3A-3B primarily with reference to offcut angles varying from about 5 degrees to about 30 degrees, other substrate materials, substrate orientations, offcut angles, and offcut directions may be used without differing from the scope of the present invention. Further, due to manufacturing tolerances, a substrate prepared based on an offcut angle and/or direction according to some embodiments of the present invention may vary by small amounts relative to the intended offcut angle and direction. In other words, offcut angles and directions described herein refer to intended values, and small differences are assumed without departing from the scope of the present invention. In addition, due to manufacturing tolerances, the deposition of thermoelectric layers may invariably occur on a vicinal surface. Accordingly, the scope of the present invention includes the deposition of thermoelectric layers where the offcut of the substrate is intentionally controlled to result in improved material and/or device properties.

FIGS. 4A-4F illustrate examples of n-type thermoelectric films epitaxially grown on GaAs substrates having several different crystal orientations evaluated in conjunction with substrates according to some embodiments of the present invention. More particularly, FIG. 4A is an optical micrograph illustrating an n-type epitaxial film 410a grown on a GaAs substrate having a growth surface offcut from the (100) plane by about 2° toward the <110> direction, also referred to hereinafter as the 2° film. FIG. 4B is an optical micrograph illustrating an n-type epitaxial film 410b grown on a GaAs substrate having a growth surface offcut from the (100) plane by about 6° toward the <110> direction, also referred to as the 6° film. FIG. 4C is an optical micrograph illustrating an n-type epitaxial film 410c grown on a GaAs substrate having a growth surface offcut from the (100) plane by about 10° toward the <110> direction, also referred to as the 10° film. FIG. 4D is an optical micrograph illustrating an n-type epitaxial film 410d grown on a GaAs substrate having a growth surface offcut from the (100) plane by about 15° toward the <110> direction, also referred to as the 15° film. FIG. 4E is an optical micrograph illustrating an n-type epitaxial film 410e grown on a GaAs substrate having a growth surface parallel to the (111) plane (also referred to as the (111) film), and FIG. 4F is an optical micrograph illustrating an n-type epitaxial film 410f grown on a GaAs substrate having a growth surface offcut from the (111) plane by about 2° toward the <2-1-1> direction (also referred to as the (111) 2° film). The optical micrographs of FIGS. 4A-4F illustrate a film dimension of 2.2 mm×2.2 mm.

In the embodiments of FIGS. 4A-4F, 2-4 μm thick n-type films were grown initially, followed by x-ray diffraction, optical and electron microscopy, and Seebeck and Hall measurements. All films were grown using substantially similar growth conditions. As shown in FIGS. 4A-4F, surface defects are increased in the (111) film 410e of FIG. 4E and in the 2° film 410a of FIG. 4A relative to the other films 410b, 410c, 410d and 410f. Cracks are also evident in the 2° film 410a (about 6 cracks/mm) and in the (111) 2° film 410f (about 4 cracks/mm) via optical microscopy. As such, the films 410b, 410c, and 410d of FIGS. 4B, 4C, and 4D crown on substrates offcut from the (100) plane by an offcut angle in the range of about 5° to about 30° toward the <110> direction exhibited relatively fewer surface defects and almost no visible cracks (i.e., less than about 0.45 cracks/mm) than those of the films 410a and 410e. Additional growth experiments were conducted for thicker n-type and p-type films on the 15° (100) toward <110> surface, as discussed in greater detail below with reference to FIGS. 7 and 9 and Table 2.

Figure 5C:
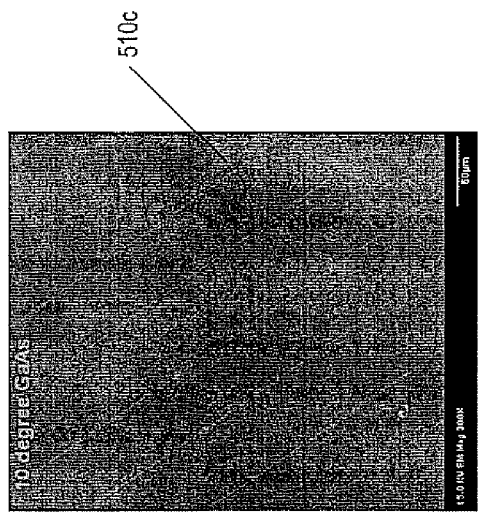
FIGS. 5A-5F are scanning electron microscope (SEM) micrographs illustrating n-type thermoelectric films epitaxially grown on gallium arsenide substrates of different crystal orientations including substrates according to some embodiments of the present invention.
Figure 5B:
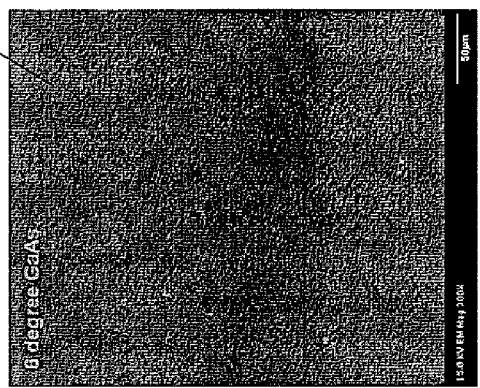
Figure 5A:
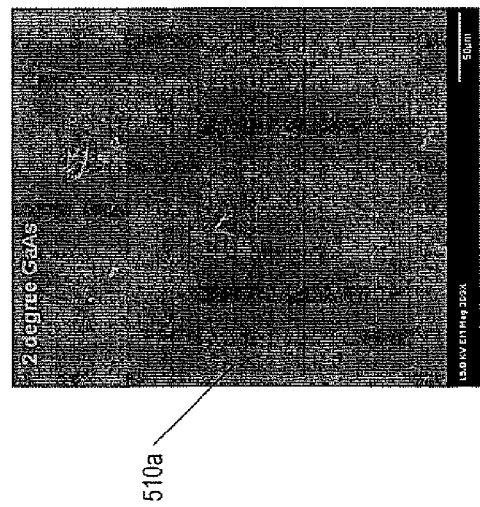
Figure 5F:
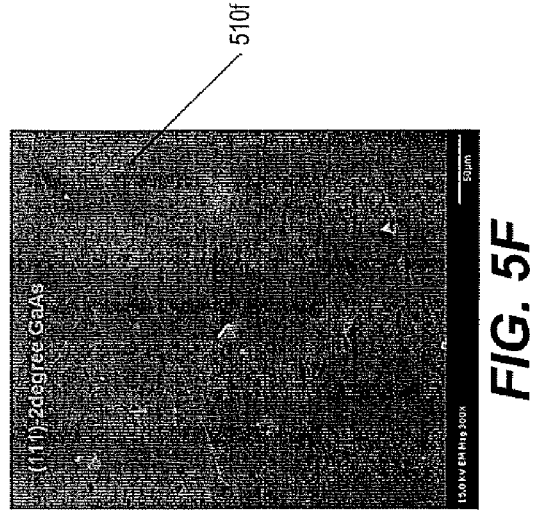
Figure 5E:
Figure 5D:
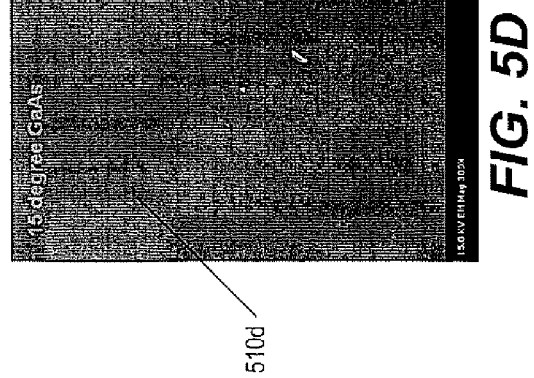

FIGS. 5A-5E illustrate scanning electron microscope (SEM) micrographs of n-type thermoelectric films epitaxially grown on GaAs substrates having several different crystal orientations evaluated in conjunction with substrates according to some embodiments of the present invention. More particularly, FIG. 5A illustrates an n-type epitaxial film 510a grown on a GaAs substrate having a growth surface offcut from the (100) plane by about 2° toward the <110> direction, also referred to hereinafter as the 2° film. FIG. 5B illustrates an n-type epitaxial film 510b grown on a GaAs substrate having a growth surface offcut from the (100) plane by about 6° toward the <110> direction, also referred to as the 6° film. FIG. 5C illustrates an n-type epitaxial film 510c grown on a GaAs substrate having a growth surface offcut from the (100) plane by about 10° toward the <110> direction, also referred to as the 10° film. FIG. 5D illustrates an n-type epitaxial film 510d grown on a GaAs substrate having a growth surface offcut from the (100) plane by about 15° toward the <110> direction, also referred to as the 15° film. FIG. 5E illustrates an n-type epitaxial film 510e grown on a GaAs substrate having a growth surface parallel to the (111) plane (also referred to as the (111) film), and FIG. 5F illustrates an n-type epitaxial film 510f grown on a GaAs substrate having a growth surface offcut from the (111) plane by about 2° toward the <2-1-1> direction (also referred to as the (111) 2° film).

As shown in the SEM micrographs of FIGS. 5A-5F, surface defects are evident in the 2° film 510a, the (111) film 510e, and the (111) 2° film 510f. However, fewer surface defects are evident in the 6° film 510b, the 10° film 510c, and the 15° film 510*d*. Cracks are also evident in the 2° film 510*a* (about 16 cracks/mm) and the (111) 2° film 510*f* (about 10 cracks/mm). However, as shown in FIG. 5D, reduced cracking is provided in the 15° film 510*d*, as well as in the 6° film 510*b* of FIG. 5B, relative to the other films 510*a*, 510*e*, and 510*f*. Accordingly, the films 510*b*-510*d* grown on substrates offcut from the (100) plane by an offcut angle in the range of about 5° to about 30° toward the <110> direction exhibited lower crack densities and fewer surface defects than those of the films 510*a*, 510*e*, and 510*f*.

Figure 6B:
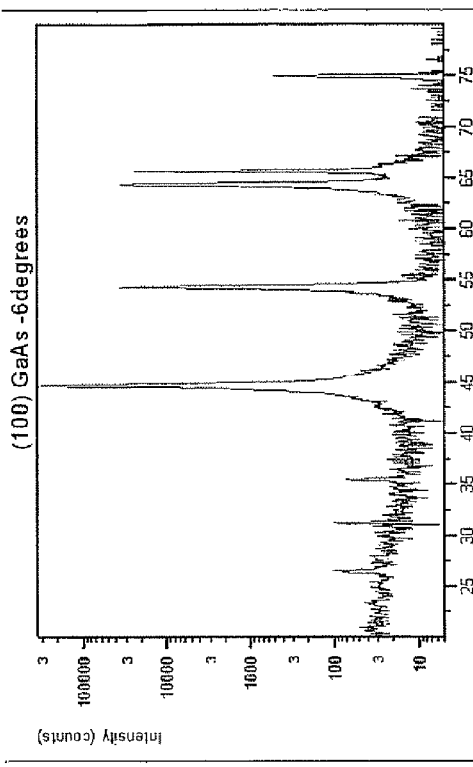
FIGS. 6A-6F are graphs illustrating x-ray diffraction (XRD) of n-type thermoelectric films epitaxially grown on gallium arsenide substrates of different crystal orientations including substrates according to some embodiments of the present invention.
Figure 6D:
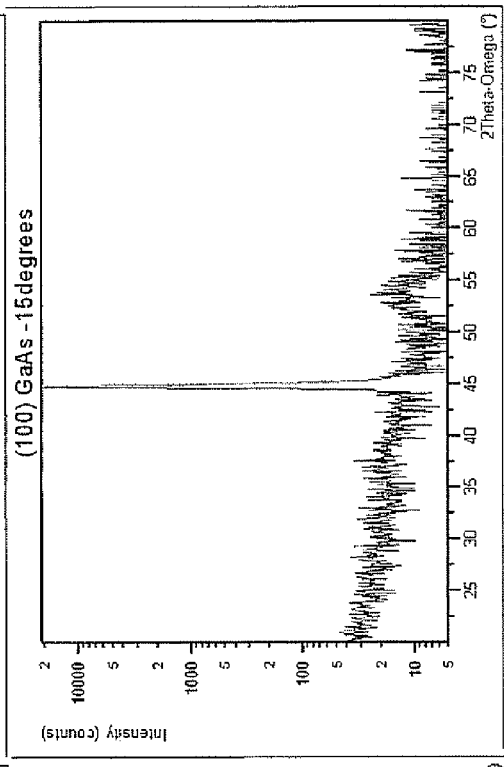
Figure 6A:
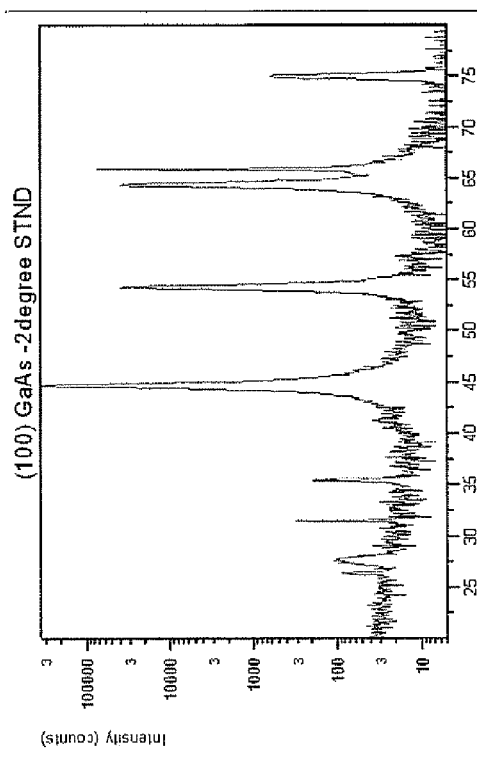
Figure 6C:
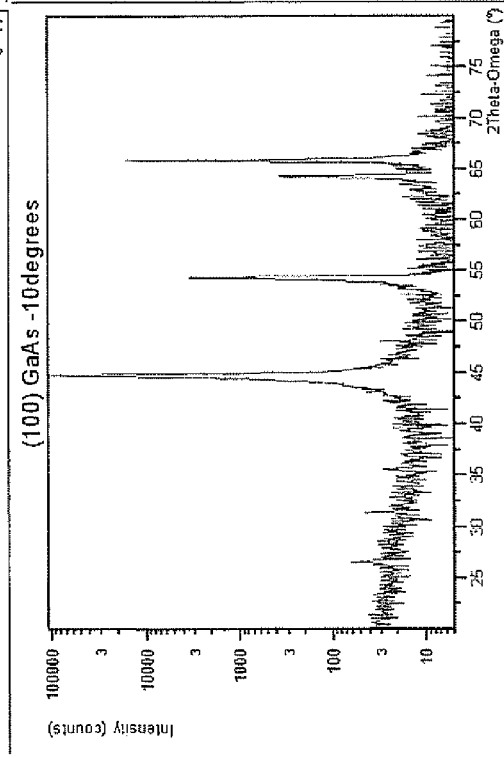
Figure 6E:
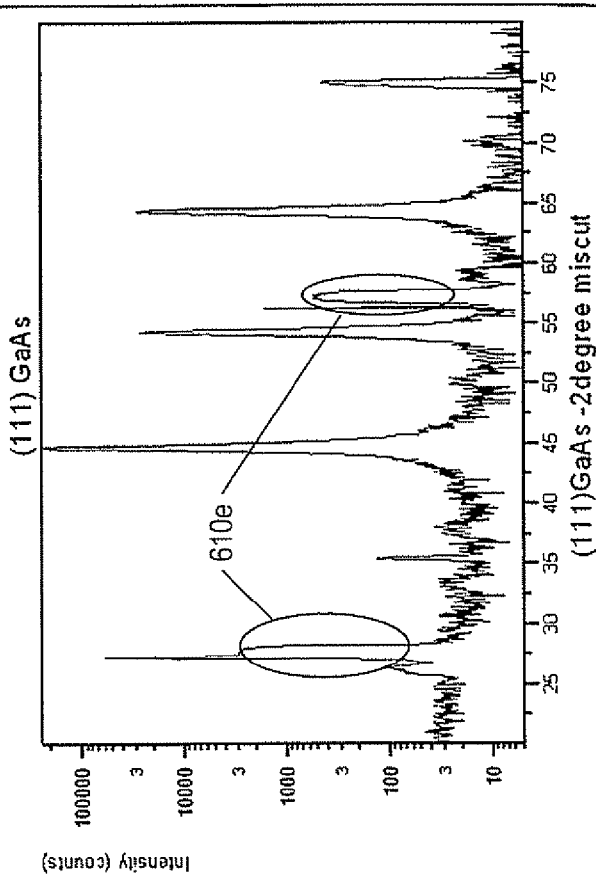
Figure 6F:
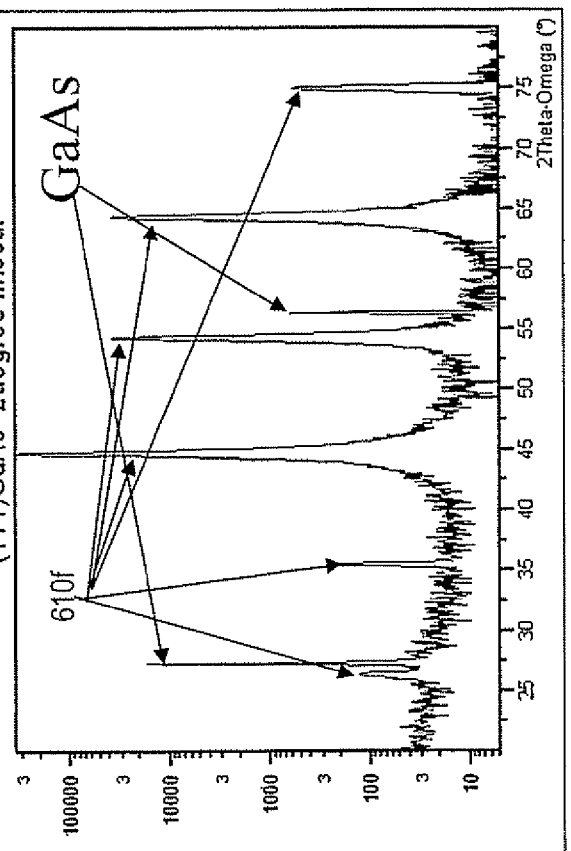

FIGS. 6A-6F illustrates X-Ray Diffraction (XRD) of n-type thermoelectric films epitaxially grown on Gas substrates having several different crystal orientations evaluated in conjunction with substrates according to some embodiments of the present invention. More particularly, FIG. 6A illustrates x-ray diffraction of an n-type epitaxial film grown on a GaAs substrate having a growth surface offcut from the (100) plane by about 2° toward the <110> direction, also referred to hereinafter as the 2° film. FIG. 6B illustrates x-ray diffraction of an n-type epitaxial film grown on a GaAs substrate having a growth surface offcut from the (100) plane by about 6° toward the <110> direction, also referred to as the 6° film. FIG. 6C illustrates x-ray diffraction of an n-type epitaxial film grown on a GaAs substrate having a growth surface offcut from the (100) plane by about 10° toward the <110> direction, also referred to as the 10° film. FIG. 6D illustrates x-ray diffraction of an n-type epitaxial film grown on a GaAs substrate having a growth surface offcut from the (100) plane by about 15° toward the <110> direction, also referred to as the 15° film. FIG. 6E illustrates x-ray diffraction of an n-type epitaxial film grown on a GaAs substrate having a growth surface parallel to the (111) plane (also referred to as the (111) film), and FIG. 6F illustrates x-ray diffraction of an n-type epitaxial film grown on a GaAs substrate having a growth surface offcut from the (111) plane by about 2° toward the <2-1-1> direction (also referred to as the (111) 2° film).

As shown in FIG. 6A-6D, in films deposited on (100) vicinal GaAs, the primary $Bi_2Te_3$ peak (0015) is observed at approximately 45° $\Theta$. Other major observable peaks are associated with the GaAs substrate or the (00l) reflections of $Bi_2Te_3$, where l=9, 12, 15, 18, 21, and 24, indicating growth of the films along the crystallographic c-axis.

As further shown in FIGS. 6E-6F, the peaks 610*f* observed on the (111) 2° film are (00l), where l=9, 12, 15, 18, 21, and 24. For the case of the (111) film, some other unidentified peaks 610*e* are observed, indicating a non-c-plane orientation. Although cracks are observed, the crystalline structure of the (111) 2° film appears to be relatively good.

Table 1 further illustrates the properties of the n-type thermoelectric films epitaxially grown on various GaAs substrates, as discussed above with reference to FIGS. 4A-4F, 5A-5S, and 6A-6F. The samples illustrated in Table 1 were grown using substantially similar growth conditions.

As shown in Table 1, the 6°, 10°, and 15° thermoelectric films according to some embodiments of the present invention exhibited lower Seebeck coefficients, and thus, lower thermoelectric power factors (PF) than the 2°, (111), and/or (111) 2° films. However, it should be noted that, when conditions are improved and/or optimized for substrates having growth surfaces that are offcut according to some embodiments of the present invention, the power factors for the 6°, 10°, and 15° thermoelectric films may be comparable to those of the 2°, (111), and/or (111) 2° films. Thus, thermoelectric films grown on substrates having growth surfaces that are offcut from the (100) plane by an offcut angle in the range of about 5° to about 30° according to some embodiments of the present invention may provide improved thermoelectric performance with reduced cracking.

Figure 7:
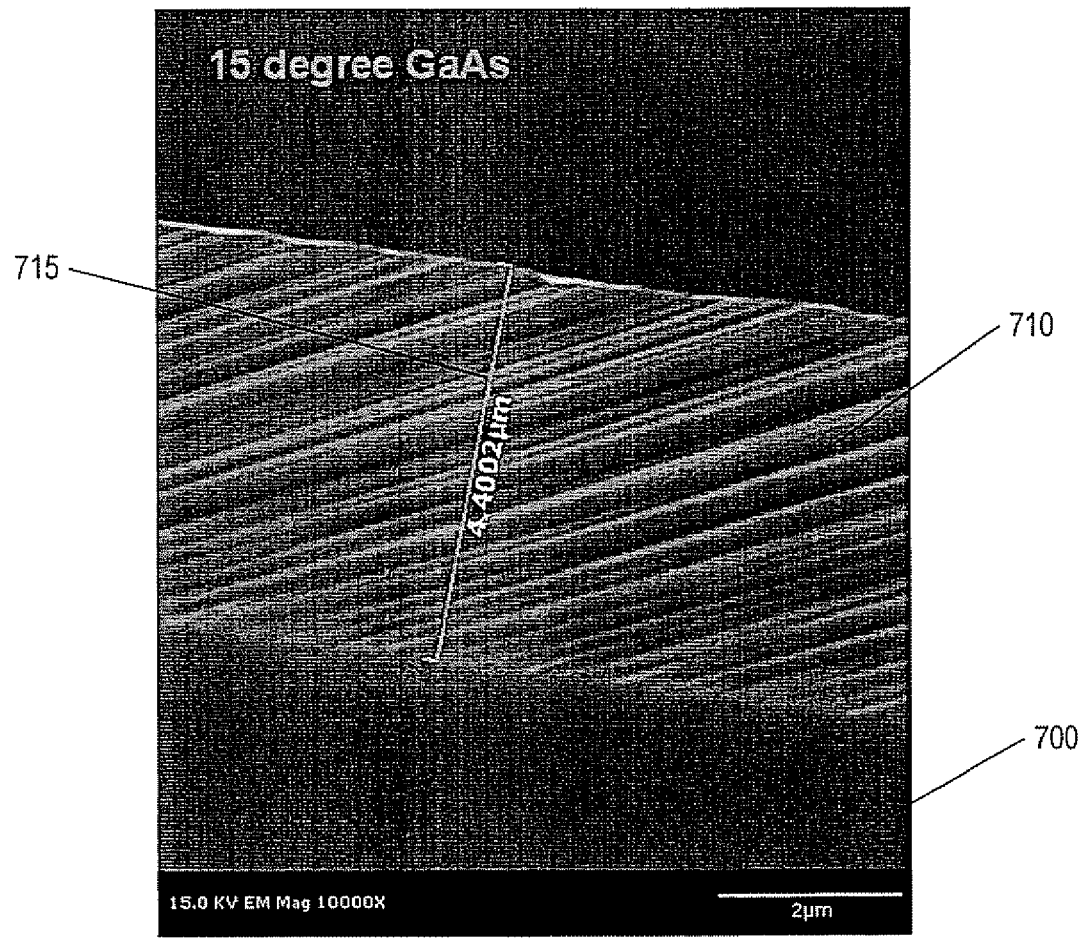
FIG. 7 is a cross-sectional view illustrating a thermoelectric film grown on a gallium arsenide substrate according to some embodiments of the present invention.

FIG. 7 illustrates film properties of a GaAs substrate according to some embodiments of the present invention. Referring now to FIG. 7, an SEM cross-section of a thermoelectric film 710 grown on a 15° off-axis (100) GaAs surface 700 is shown. The film 710 has a thickness 715 of approximately 4.4 μm. Based on x-ray diffraction measurements, the c-plane lattice orientation of the film 710 is about 11.5° relative to the plane defined by the substrate surface 700. In contrast, the c-plane lattice orientation of conventional epitaxial films grown on 2° off-axis (100) substrates may be about 1° relative to the plane defined by the substrate surface. Also, growth rates increased as the offcut angle of the substrate surface 700 was increased, for example, due to an increased number of nucleation kink sites. Subsequent n-type film depositions were also conducted on the 15° off-axis substrate according to some embodiments of the present invention. Films of 6 μm and 10.8 μm without significant cracks were observed. The deposition rates of thermoelectric films according to some embodiments of the present invention were observed to be approximately two times that of a conventional epitaxial film deposited on a 2° off-axis substrate.

Figure 8:
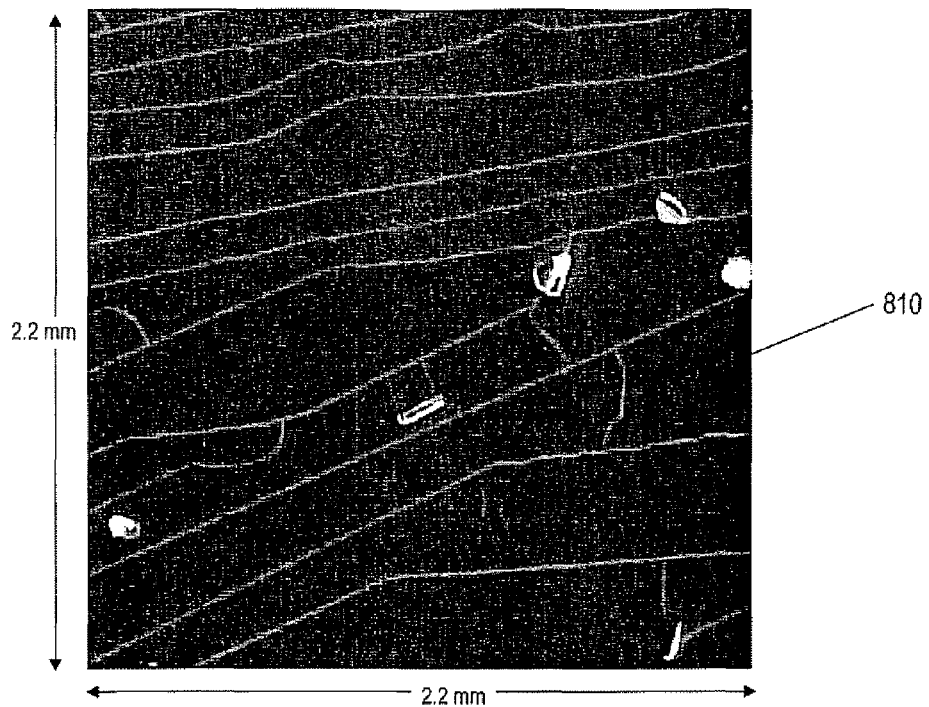
FIG. 8 is an optical micrograph illustrating a thermoelectric film epitaxially grown on a gallium arsenide substrate.
Figure 9:
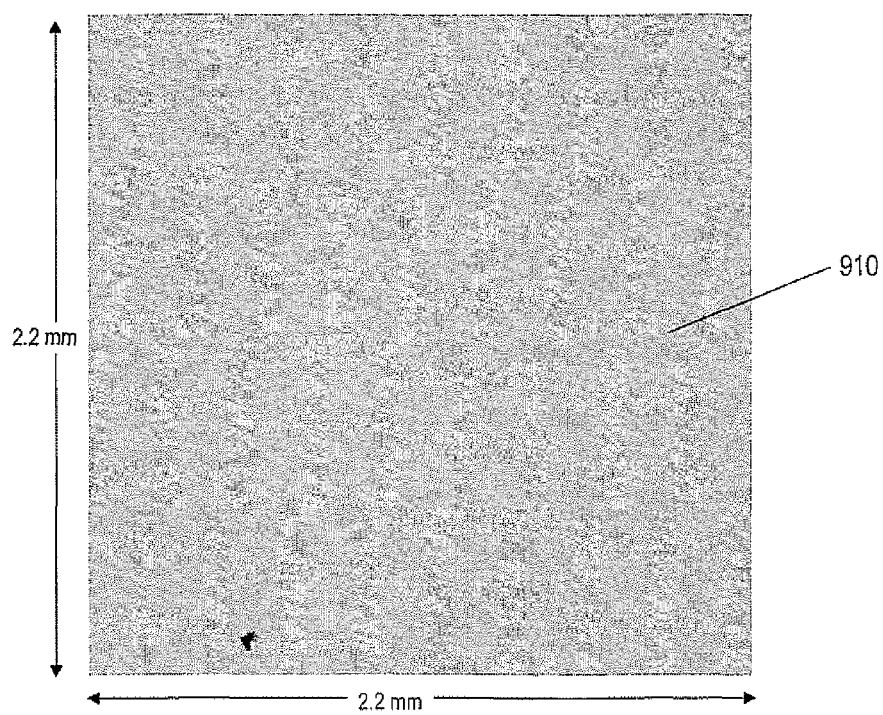
FIG. 9 is an optical micrograph illustrating a thermoelectric film epitaxially grown on a gallium arsenide substrate according to some embodiments of the present invention.

FIG. 8 illustrates optical microscopy of a p-type thermoelectric film 810 epitaxially grown on a GaAs growth surface that is offcut 2° relative to the (100) plane toward the <110> direction, while FIG. 9 illustrates optical microscopy of a p-type thermoelectric film 910 according to some embodiments of the present invention epitaxially grown on a GaAs growth surface that is offcut 15° relative to the (100) plane toward the <110> direction. The p-type films of FIGS. 8 and 9 were grown on the respective substrates to a thickness of approximately 6 μm. As shown in FIG. 9, the p-type thermoelectric film 910 grown on the 15° off-axis substrate, as with the n-type films, was substantially crack-free with relatively good surface morphology (i.e., few or no surface defects).

Measured Hall and Seebeck data for the above p-type and n-type thermoelectric films grown on 15° offcut Gas toward the <110> direction is provided below in Table 2.

TABLE 1

| Sample | Thickness (μm) | Rate (Å/min) | Resist. (Ω-cm) | Mobility ($cm^2$/V-s) | Carriers ($cm^{-3}$) | Seebeck (μV/K) | PF(μW K – 2 cm – 1) |
|---|---|---|---|---|---|---|---|
| 2° film | 2.5 | 188 | 2.38E–03 | 178 | 1.48E+19 | –371 | 58 |
| 6° film | 3.1 | 238 | 2.11E–03 | 220 | 1.34E+19 | –304 | 44 |
| 10° film | 4.2 | 329 | 3.41E–03 | 185 | 9.91E+18 | –287 | 24 |
| 15° film | 4.4 | 346 | 2.87E–03 | 191 | 1.41E+19 | –278 | 27 |
| (111) film | 1.1 | 71 | 1.06E–03 | 215 | 2.74E+19 | –329 | 102 |
| (111) 2° film | 2.2 | 163 | 1.76E–03 | 188 | 1.88E+19 | –318 | 57 |

TABLE 2

| Film Type | Thickness (μm) | Resist. (Ω-cm) | Mobility (cm$^2$/V-s) | Carriers (cm$^{-3}$) | Seebeck (μV/K) | PF(μW K$^{-2}$ cm$^{-1}$) |
|---|---|---|---|---|---|---|
| p-type | 3.9 | 2.25E−03 | 219 | 1.27E+19 | 275 | 34 |
| p-type | 5.6 | 1.25E−03 | 254 | 1.96E+19 | 268 | 57 |
| p-type | 6.2 | 8.32E−04 | 299 | 2.51E+19 | 262 | 83 |
| n-type | 6.3 | 1.84E−03 | 252 | 1.35E+19 | −347 | 65 |
| n-type | 10.8 | 1.71E−03 | 265 | 1.38E+19 | −350 | 72 |

Figure 10A:
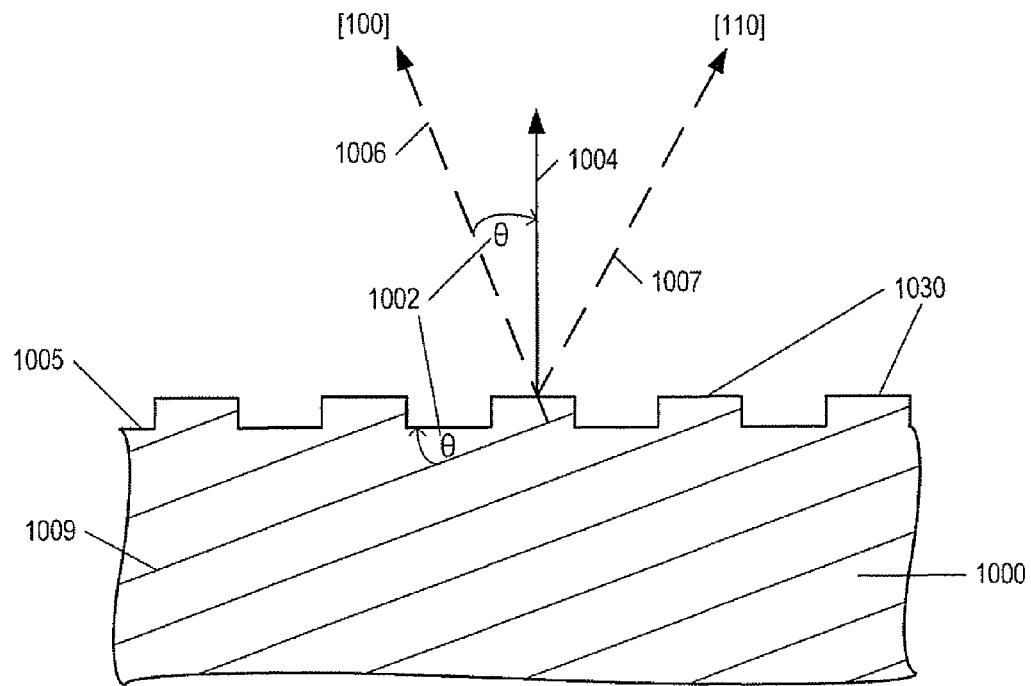
FIGS. 10A-10B are cross-sectional views illustrating methods of fabricating thermoelectric films on patterned substrates according to other embodiments of the present invention.
Figure 10B:
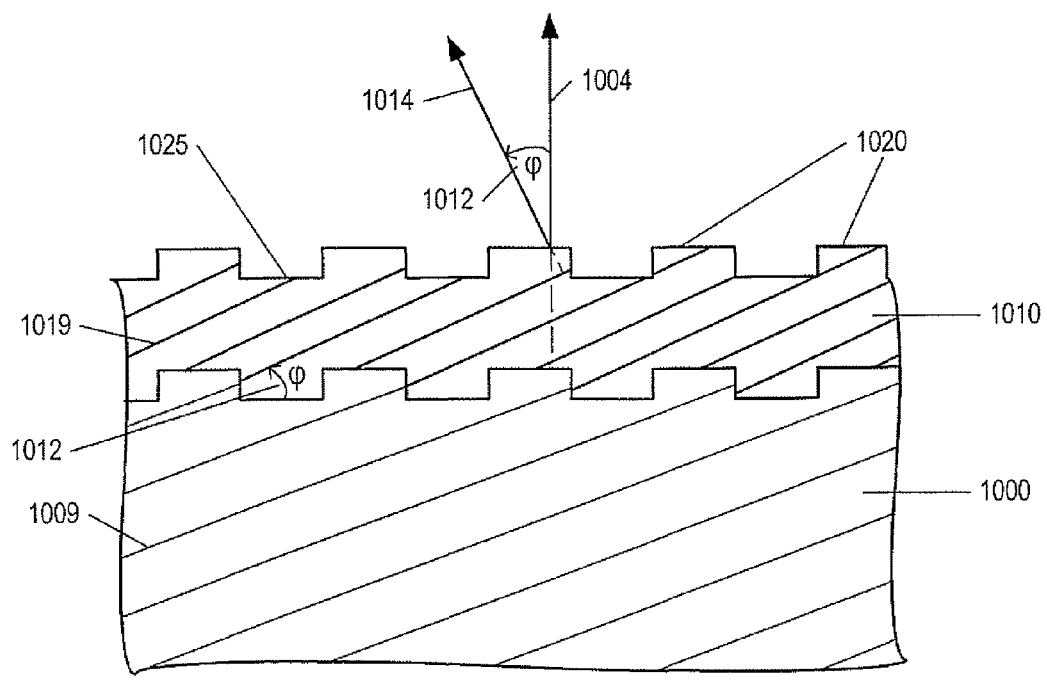

FIGS. 10A-10B illustrate methods of fabricating thermoelectric films on patterned substrates according to other embodiments of the present invention. Referring now to FIG. 10A, a substrate 1000 is patterned and etched to define a plurality of mesas 1030 protruding from the surface 1005 of the substrate 1000. For example, a mask pattern (not shown) may be formed on the surface 1005 of the substrate 1000, an etching process may be used to remove portions of the substrate 1000 not covered by the mask, and the mask pattern may be removed to define the mesas 1030. The mesas 1030 may be substantially circular in plan view, and may have a diameter of about 200 μm or less in some embodiments. However, in other embodiments, the mesas 1030 may be elliptical or rectangular in plan view. In still other embodiments, the mesas 1030 may be elongated rectangles extending along the substrate 1000 to define "stripes" in plan view. The stripes may be oriented to be parallel to a direction in which cracks are typically formed. For instance, in n-type BiTe on (100) GaAs or other particular substrate, cracks may be known to form in a particular direction, and the mesas 1030 may be formed to run parallel to this direction with a spacing less than the nominal crack spacing. As such, when a thermoelectric film 1010 is epitaxially grown on the surface 1005 of the substrate 1000 as discussed below with reference to FIG. 10B, substantially, crack free stripe-shaped thermoelectric film mesas 1020 may be produced.

In some embodiments, the surface 1005 of the substrate 1000 may be a vicinal growth surface that is offcut from a {100} plane, for example, as defined by the crystallographic orientation 1009 of the substrate 1000. The surface 1005 of the substrate 1000 may be offcut from the {100} plane toward a <10> direction at an offcut angle of up to about 30 degrees. More particularly, as illustrated in detail in FIG. 10A, the normal 1004 through the growth surface 1005 is tilted toward the [110] direction 1007 at an offcut angle θ1002 in the range of about 0° to about 45° off-axis from the [100] direction 1006. For example, the offcut angle θ1002 may be about 5° to about 30°, and in some embodiments, about 10° to about 25°. In particular embodiments of the present invention, the offcut angle θ1002 may be about 15 degrees toward the <110> direction relative to the (100) plane.

Referring now to FIG. 10B, a thermoelectric (TE) film 1010 is epitaxially grown on the surface 1005 of the substrate 1000. The thermoelectric film 1010 may be a compound including Group V elements (such as bismuth (Bi) antimony (Sb), and/or lead (Pb)), and Group VI elements (such as tellurium (Te) and/or selenium (Se)). The thermoelectric film 1010 may be grown along its c-axis 1014 on the growth surface 1005 of the substrate 1000 in a substantially similar manner as described above with reference to FIGS. 3A-3B, and as such, further description thereof is omitted. Due to patterning of the substrate 1000 described above with reference to FIG. 10A prior to growth of the film 1010, thermoelectric film mesas 1020 may also be formed protruding from the growth surface 1005. The mesas 1020 may likewise be substantially circular, elliptical, or rectangular in plan view. For example, where the mesas 1030 in the substrate 1000 are substantially circular, substantially circular mesas 1020 may be similarly formed protruding from the growth surface 1005, and may similarly have a diameter of about 200 μm or less in some embodiments. Likewise, where the mesas 1030 in the substrate 1000 are substantially rectangular, the mesas 1020 may also be substantially rectangular, and may similarly extend parallel to a known direction in which cracks are typically formed in some embodiments. Depending on a thickness of the film 1010, dimensions of the mesas 1020 may change and/or definition of the mesas 1020 may be reduced, for example, due to pattern washout.

Still referring to FIG. 10B, where the surface 1005 of the substrate 1000 is a vicinal (100) surface, a crystallographic growth direction of the thermoelectric film 1010 along the c-axis 1014 is not perpendicular to the surface 1005. More particularly, the c-plane of the thermoelectric film 1010 may have a crystallographic orientation (indicated by hatched lines 1019) that is tilted by up to about 30 degrees relative to the plane defined by the surface 1005 and/or the plane defined by the surface 1025 of the film 1010 itself. In other words, as illustrated in detail in FIG. 10B, the c-axis 1014 of the thermoelectric film 1010 is tilted off-axis from the normal 1004 to the surface 1005 by an angle φ1012 of about 0° to about 30°. In some embodiments, the crystallographic tilt angle φ1012 of the thermoelectric film 1010 may be in the range of about 5° to about 30°. For example, the crystallographic tilt angle φ1012 of the thermoelectric film 1010 may be about 10° to about 30°, and in particular embodiments, may be about 15° to about 25°. Although cracking may occur in portions of the surface 1025 of the thermoelectric film 1010 between the mesas 1020, the portions of the thermoelectric film 1010 defined by the protruding surfaces of the mesas 1020 may be substantially crack-free depending on the size of the mesas 1020, as discussed below.

Although described in FIGS. 10A and 10B with reference to etching a substrate to define elliptical and/or rectangular mesas that promote epitaxial growth of thermoelectric films thereon, the present invention may include other methods for selective epitaxial growth of thermoelectric films on particular portions of the substrate. For example, a mask pattern, such as a silicon dioxide ($SiO_2$) mask, may be formed on the substrate 1000 to expose elliptical and/or rectangular portions of the substrate 1000. The mask pattern may prevent and/or inhibit growth in the masked regions. Accordingly, in such embodiments, the "mesas" may not protrude from the substrate 1000, but rather, may generally refer to an unetched or unmasked area of the substrate 1000 on which a thermoelectric film may be epitaxially Grown. In addition, a seed layer may be grown on the surface of the substrate prior to masking and/or etching the substrate for selective epitaxial growth of the thermoelectric film. For example, a seed layer of BiTe (or other Group V-Group VI alloy) may be grown on the substrate 1000 prior to etching the substrate to provide the mesas 1030 protruding therefrom. Also, such a BiTe seed layer (or other Group V-Group VI alloy) may be grown on the substrate 1000 prior to forming a mask thereon that prevents and/or inhibits growth in the masked regions. The seed layer may help nucleate growth; the mask material may prevent direct growth, but may enable high-quality lateral growth in the plane of the substrate surface. Such lateral growth may or may not coalesce. The dimensions of the mask may be chosen so as to reduce, prevent, and/or minimize the incidence of cracks, and may vary depending on the substrate of choice.

Figures 11A, 11B, 11C:
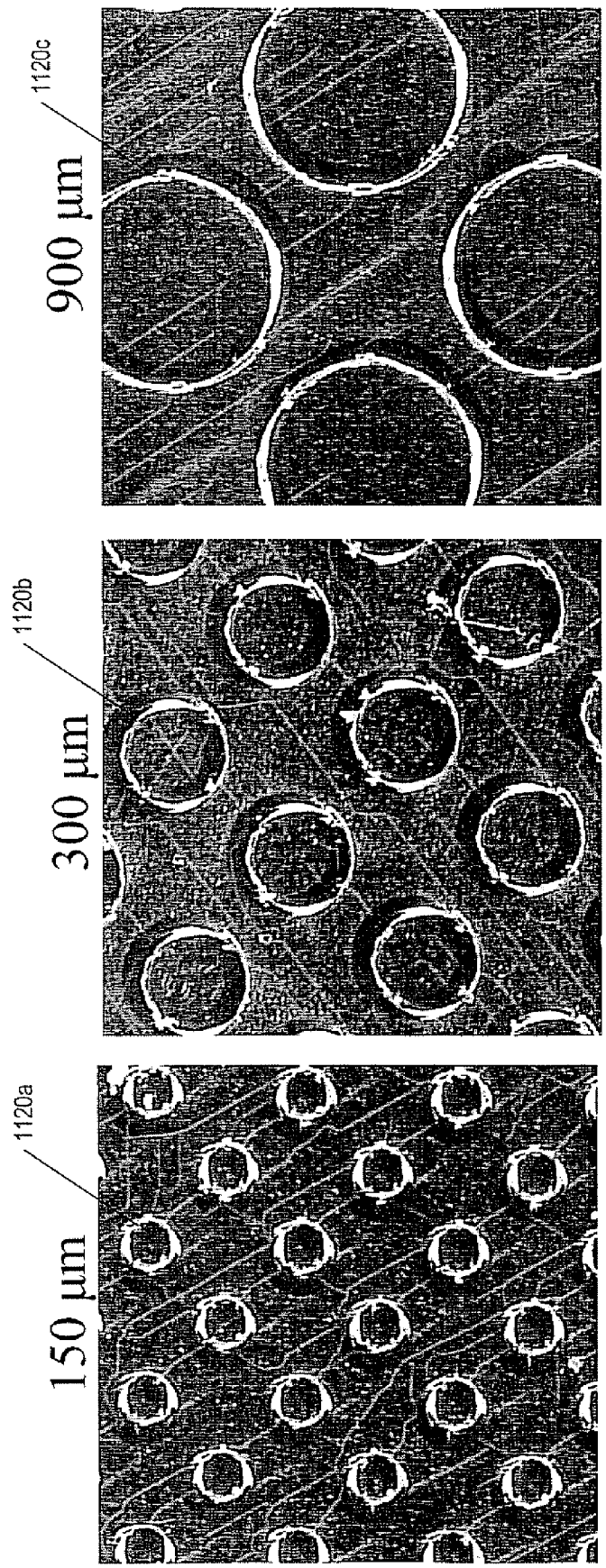
FIGS. 11A-11C are optical micrographs illustrating thermoelectric films epitaxially grown on different patterned substrates according to other embodiments of the present invention.

FIGS. 11A-11C are optical micrographs illustrating thermoelectric films epitaxially grown on different patterned substrates according to other embodiments of the present invention. Referring now to FIGS. 11A-11C, substantially circular mesas 1120a-1120c were patterned and etched by reactive ion etching (RIE) into GaAs substrates having growth surfaces 2° off-axis of the (100) plane. Mesas of different diameters were etched to investigate variations in angle and size, and a 2.7 μm thick n-type film was grown on each wafer. More particularly, FIG. 11A illustrates results for a thermoelectric film grown on a GaAs substrate patterned with mesas 1120a having a diameter of about 150 μm. Similarly, FIG. 11B illustrates results for a thermoelectric film grown on a GaAs substrate patterned with mesas 1120b having a diameter of about 300 μm, while FIG. 11C illustrates results for a thermoelectric film grown on a GaAs substrate patterned with mesas 1120c having a diameter of about 900 μm. As shown in FIG. 11A, relatively little cracking is observed in the 150 μm mesas 1120a. In particular, the 150 μm mesas 1120a may have a crack density of less than about 1 crack/mm, and in some embodiments, less than about 0.1 cracks/mm. However, in the 300 μm mesas 1120b of FIG. 11B, some cracking (about 1.7 cracks/mm) is observed. Furthermore, in the 900 μm mesas 1120c of FIG. 11C, substantially more cracking is observed (about 2.5 cracks/mm). Accordingly, some embodiments of the present invention may use thermoelectric films grown on substrates patterned with mesas having a diameter of about 200 μm or less.

However, as reduced cracking may occur in embodiments where the growth surface of the patterned substrate is tilted at an offcut angle in the range of about 5° to about 45°, as described above, larger diameter mesas may be provided while maintaining a desired crack density. For instance, GaAs substrates having growth surfaces 6° or 15° off-axis of the (100) plane may be used to grow substantially crack-free mesas (e.g., less than about 1 crack/mm) having a diameter of less than about 400 μm, and in some embodiments, less than about 300 μm. Also, in embodiments where the mesas are square and/or substantially rectangular in plan view, the mesas may have widths corresponding to the diameters described above. Accordingly, some embodiments of the present invention may employ a combination of patterned substrates and substrates having increased offcut growth surfaces to provide thermoelectric films with reduced cracking.

FIGS. 12A-12D are cross-sectional views illustrating assembly of a P-N thermocouple for use in thermoelectric devices according to some embodiments of the present invention. As used herein, the term "thermoelectric element" includes a structure having a layer of a thermoelectric film according to some embodiments of the present invention (such as $Bi_2Te_3$) with a Seebeck coefficient sufficient to provide thermoelectric heat pumping (heating or cooling) responsive to an electrical current therethrough and/or electrical power generation responsive to a temperature gradient across the thermoelectric element. A thermoelectric element, for example, may include one or more P-N couples with a P-N couple having a P-type thermoelectric element and an N-type thermoelectric element electrically coupled in series and thermally coupled in parallel and configured to provide thermoelectric heating, cooling, and/or power generation.

As shown in FIG. 12A, a thin film layer of a thermoelectric material 1210 (such as bismuth telluride or $Bi_2Te_3$) is epitaxially grown on a sacrificial substrate 1200 (such as a GaAs substrate) as discussed above, for example, with reference to FIGS. 3A-3B. The growth surface 1205 of the substrate 1200 may be offcut by an offcut angle θ in the range of about 5 degrees to about 45 degrees relative to a {100} plane toward a <110>, as discussed above, such that a crystallographic growth direction (indicated by hatched lines 1219) along the c-axis of the thin film thermoelectric material 1210 is not normal to the growth surface 1205 of the substrate 1200, but rather, is in the range of about 5 degrees to about 30 degrees off of the normal to the growth surface 1205. In other words, the thin film thermoelectric material 1210 has a crystallographic tilt angle φ of about 5 degrees to about 30 degrees relative to a surface 1222 of the thermoelectric material 1210 adjacent to the offcut surface 1205 of the substrate 1200. The substrate 1200 is then patterned, cut, or otherwise formed to provide separate thermoelectric elements 1203. P-type and n-type thermoelectric elements may be separately formed on different substrates. A substrate with p-type thermoelectric elements may be diced to provide separate p-type thermoelectric elements, and a substrate with n-type thermoelectric elements may be diced to provide separate n-type thermoelectric elements. It is to be understood that the crystallographic tilt angle φ need not be the same for n-type and p-type thermoelectric elements.

As shown in FIG. 12B, a first header 1221 (such as a thermally conductive ceramic plate) includes a conductive metal trace 1207 thereon. A p-type thermoelectric element 1203a and an n-type thermoelectric element 1203b are bonded to the metal trace 1207, for example, using solder layers 1209. Portions 1201 of the sacrificial substrate(s) 1200 may be maintained on the thermoelectric elements 1203a and 1203b after bonding the respective thermoelectric elements 1203a and 1203b to the metal trace 207. As the header 1221 may extend parallel to the growth surface of the substrate 1200, the bonded thermoelectric elements 1203a and 1203b may also have a crystallographic tilt angle in the range of about 5 degrees to about 30 degrees relative to the header 1221. As shown in FIG. 12C, remaining portions of the sacrificial substrates 1201 may be removed, and metal contacts 1211 may be formed (e.g., electroplated) on the thermoelectric elements 1203a and 1203b. A second header 1231 with complementary traces 1217 may be bonded to the metal contacts 1211, for example, using solder layers 1215, as shown in FIG. 12D. Thus, thermoelectric devices according to some embodiments of the present invention may include thermoelectric elements 1203a and 1203b that are fabricated in accordance with the methods described above with reference to FIGS. 3A-3B and/or FIGS. 10A-10B.

According to some embodiments of the present invention, the first header 1221 may be an integrated circuit (IC) semiconductor chip, and the second header 1231 may be a packaging substrate such as a printed circuit board substrate, a laminate carrier substrate, a chip carrier, a ball grid array substrate, a pin grid array substrate, a flip chip package substrate, a printed wire board, and/or any other substrate to which an integrated circuit chip or other electronic device may be bonded to provide a chip scale package. More particularly, the integrated circuit semiconductor chip (as the first header 1221) may include an active side having electronic devices thereon adjacent the metal trace(s) 1207 and a backside opposite the active side. Conversely, in other embodiments, the second header 1231 may be an IC semiconductor chip, and the first header 1221 may be a packaging substrate. The P- and N-type thermoelectric elements 1203a and 1203b together define a P-N couple connected in series electrically, which may provide for either Peltier cooling and/or Seebeck power generation. According to some embodiments of the present invention, the first header 1221 may be a substrate of a semiconductor electronic device or other structured to be heated/cold, and the second header 1231 may be a heat transfer structure such as a thermal mass, a heat sink, a heat spreader, a heat pipe, etc.

By providing the thermoelectric elements 1203 of a thermoelectric cooler between the flip chip IC semiconductor device and the packaging substrate, thermoelectric cooling may be provided more directly adjacent heat generating circuitry on the active side of the IC semiconductor device without requiring heat transfer through the IC semiconductor device to a back side thereof. In addition, operations of forming the thermoelectric cooler may be integrated with operations of flip chip packaging. Moreover, alignment of the thermoelectric cooler with a known hot spot on the active side of the IC semiconductor chip may be more easily facilitated than if thermoelectric cooling is provided on the backside of the IC semiconductor chip. If the packaging substrate is thermally conductive, further modification thereof may not be required. If the packaging substrate is not thermally conductive (e.g., a printed circuit board substrate, a laminate carrier substrate, etc.), a thermally conductive via(s) (e.g., a copper via) may be provided through the packaging substrate adjacent the thermoelectric elements 1203 to enhance thermal conduction through the packaging substrate.

Accordingly, some embodiments of the present invention involve methods for depositing epitaxially grown thermoelectric films on GaAs substrates and related devices. In particular, in some embodiments, a GaAs substrate is cut off-axis of the (100) plane toward the <110> direction to define a growth surface at an offcut angle in the range of about 5 degrees to about 45 degrees. In some embodiments, the offcut angle may be in the range of about 10 degrees to about 30 degrees. As such, one of a number of offcut angles for the substrate surface may be used. For example, in some embodiments, the offcut angle may be about 15°. As such, thermoelectric films having reduced cracking and/or substantially crack-free thermoelectric films may be epitaxially grown on the offcut growth surface. In addition to reduced cracking and/or surface defects, the methods described above may provide for an accelerated deposition rate as compared to a film crown on the (100) plane substrate cut at about 2° toward the <110> direction.

The above-described methods of depositing epitaxially grown thermoelectric films may also be applied to reducing and/or eliminating out-of-plane surface defects in thermoelectric films formed on GaAs substrates. In some embodiments, improved results may be observed with the GaAs substrate cut at about 15° off-axis of the (100) plane toward the <110> direction.

A signature of growing the substantially crack-free and/or reduced cracking thermoelectric epitaxial films on GaAs substrates that are cut off-axis of the (100) plane toward the <110> direction is that the c-axis of the thermoelectric films is not normal to the growth surface of the GaAs substrate. The c-axis may be many different angles. In some embodiments, the c-axis may be in the range of about 5° to about 30° off of the normal to the GaAs growth surface, and in particular embodiments, may be about 10° to about 25° off-normal. For example, when the offcut angle of a GaAs growth surface is about 15°, the c-axis of the thermoelectric film may be about 11.5° off of the normal to the GaAs growth surface.

Deposition of reduced cracking, substantially crack-free and/or semi crack-free thermoelectric films according to some embodiments of the present invention was also demonstrated on GaAs substrates patterned to define a plurality of protruding mesas. The mesas of GaAs may be generated, for example, by plasma etching into a GaAs wafer. The growth surface of the GaAs substrate may also be offcut from the (100) plane at an offcut angle of up to about 300 toward the <110> direction. For example, in some embodiments, a GaAs growth surface having an offcut angle in the range of about 5° to about 30° may be patterned to define mesas having a diameter of about 150 μm or less for thermoelectric film growth. The protruding mesas may be substantially crack-free.

While embodiments of the present invention have been described above primarily with reference to offcut thermoelectric films grown directly on offcut substrates and/or patterned substrates, it is to be understood that, in some embodiments, one or more intermediate layers may be formed on the offcut and/or patterned substrates to facilitate high quality thermoelectric film growth thereon. For instance, a silicon (Si) substrate may be referred to as a non-polar material because it is not binary and does establish an orientation preference for binary or tertiary growth. By introducing one or more layers of carbon (C), nitrogen (N), silicon carbide (SiC), and/or silicon nitride (SiN) on the growth substrate prior to the growth of the thermoelectric film, a relatively weak polarity can be established, and thus, improved thermoelectric films can be nucleated. Such an intermediate layer may also decrease, spread, and/or absorb the strain between the growth substrate and a relatively high lattice constant and/or thermally mismatched thermoelectric material. For instance, a layer with an intermediate lattice constant between a GaAs growth surface and a BiTe thermoelectric film could be deposited. Alloy layers of BiPbSbTeSe may also be used to bridge the mismatch, and may be graded to a provide a structure that has desired thermoelectric properties. Such an intermediate layer may also be sacrificial, and as such, may be removed with and/or after the substrate. Strained-layer superlattices may also be used as an intermediate layer to accommodate strain. For example, for a GaAs growth substrate, AlAs/InAs and/or other superlattice technologies developed for the GaAs material system may be employed to manage the strain at the GaAs/thermoelectric film interface. Also, a relatively pliable interlayer, such as a relatively thin metallic layer, may be used to absorb some of the lattice strain.

While the present invention has been particularly shown and described with reference to embodiments thereof, it will be understood by those of ordinary skill in the art that various changes in form and details may be made therein without departing from the spirit and scope of the present invention as defined by the following claims.

That which is claimed:

1. A method of fabricating a thermoelectric device, the method comprising:
   providing a substrate including a growth surface that is offcut relative to a plane defined by a crystallographic orientation of the substrate at an offcut angle in a range of about 10 degrees to about 45 degrees; and then
   epitaxially growing a thermoelectric film on the growth surface,
   wherein the thermoelectric film comprises a compound comprising bismuth (Bi), antimony (Sb), lead (Pb), tellurium (Te), and/or selenium (Se), and wherein the substrate comprises gallium arsenide (GaAs), silicon (Si), barium fluoride (BaF), silicon carbide (SiC), gallium nitride (GaN), aluminum nitride (AlN), sapphire, and/or glass.

2. The method of claim 1, wherein the plane defined by the crystallographic orientation of the substrate is a {100} plane, and wherein the growth surface comprises a vicinal growth surface that is offcut from the {100} plane toward a <110> direction.

3. The method of claim 2, wherein the offcut angle is in a range of about 10 degrees to about 30 degrees.

4. The method of claim 3, wherein the offcut angle is in a range of about 10 degrees to about 20 degrees.

5. The method of claim 3, wherein the offcut angle is about 15 degrees relative to the {100} plane toward the <110> direction.

6. The method of claim 1, wherein a crystallographic orientation of the thermoelectric film is tilted at an angle in a range of about 5 degrees to about 30 degrees relative to the growth surface.

7. The method of claim 6, wherein a plane defined by the crystallographic orientation of the thermoelectric film is a (0015) plane.

8. The method of claim 6, wherein the crystallographic orientation of the thermoelectric film is tilted at an angle in a range of about 10 degrees to about 25 degrees.

9. The method of claim 8, wherein the crystallographic orientation of the thermoelectric film is tilted at an angle of about 18 degrees to about 24 degrees relative to the growth surface.

10. The method of claim 8, wherein the crystallographic orientation of the thermoelectric film is tilted at an angle of about 20 degrees relative to the growth surface.

11. The method of claim 1, further comprising the following prior to epitaxially growing the thermoelectric film:
patterning the growth surface of the substrate to define a plurality of mesas protruding therefrom.

12. The method of claim 1, further comprising the following prior to epitaxially growing the thermoelectric film:
forming a mask pattern on the growth surface of the substrate to expose a plurality of portions thereof,
wherein epitaxially growing the thermoelectric film comprises epitaxially growing the thermoelectric film on the plurality of exposed portions of the growth surface.

13. The method of claim 12, further comprising:
epitaxially growing a thermoelectric film seed layer on the growth surface prior to forming the mask pattern thereon.

14. The method of claim 1, wherein the thermoelectric film has a crack density of less than about 1 crack per millimeter (mm).

15. The method of claim 14, wherein epitaxially growing the thermoelectric film comprises epitaxially growing the thermoelectric film to a thickness in a range of about 5 micrometers (μm) to about 100 μm.

16. The method of claim 15, wherein epitaxially growing the thermoelectric film comprises epitaxially growing the thermoelectric film to a thickness of about 40 μm or less.

17. The method of claim 1, wherein the thermoelectric film has a crack density of less than about 1 crack per centimeter (cm).

18. The method of claim 1, further comprising:
forming at least one intermediate layer on the growth surface of the substrate prior to epitaxially growing the thermoelectric film thereon.

19. The method of claim 18, wherein the intermediate layer comprises a strained layer superlattice.

20. The method of claim 18, wherein the intermediate layer comprises a graded layer having a lattice constant between that of the substrate and the thermoelectric film.

21. A method of fabricating a thermoelectric device, the method comprising:
patterning a substrate to define a growth surface having a plurality of mesas protruding therefrom that is offcut relative to a plane defined by a crystallographic orientation of the substrate at an offcut angle in a range of about 10 degrees to about 45 degrees; and then
epitaxially growing a thermoelectric film on the growth surface,
wherein the thermoelectric film comprises a compound comprising bismuth (Bi), antimony (Sb), lead (Pb), tellurium (Te), and/or selenium (Se), and
wherein the substrate comprises gallium arsenide (GaAs), silicon (Si), barium fluoride (BaF), silicon carbide (SiC), gallium nitride (GaN), aluminum nitride (AlN), sapphire, and/or glass.

22. The method of claim 21, wherein epitaxially growing the thermoelectric film comprises epitaxially growing the thermoelectric film including a plurality of mesas protruding from the growth surface.

23. The method of claim 22, wherein the plurality of mesas of the thermoelectric film are elliptical or rectangular in plan view.

24. The method of claim 23, wherein the plurality of mesas of the thermoelectric film comprise elongated rectangular mesas extending in a direction substantially parallel to at least one crack in the thermoelectric film.

25. The method of claim 24, wherein the plurality of mesas of the thermoelectric film have a diameter or width of about 200 micrometers (μm) or less.

26. The method of claim 22, wherein a mesa of the thermoelectric film has a crack density of less than about 1 crack per millimeter (mm).

27. The method of claim 22, wherein a crystallographic orientation of the thermoelectric film is tilted at an angle in a range of about 5 degrees to about 30 degrees relative to the growth surface.

28. The method of claim 27, wherein the plurality of mesas of the thermoelectric film have a diameter or width of about 400 micrometers (μm) or less.

29. The method of claim 27, wherein the plurality of mesas of the thermoelectric film have a diameter or width of about 300 micrometers (μm) or less.

30. The method of claim 21, wherein the plane defined by the crystallographic orientation of the substrate is a {100} plane, and wherein the vicinal growth surface is offcut from the {100} plane toward a <110> direction.

31. The method of claim 30, wherein the offcut angle is in a range of about 10 degrees to about 30 degrees.

32. The method of claim 21, further comprising:
epitaxially growing a thermoelectric film seed layer on the substrate prior to patterning the substrate.

33. A thermoelectric device, comprising:
a thermoelectric element comprising a thermoelectric film having a crystallographic orientation that is tilted at an angle in a range of about 10 degrees to about 30 degrees relative to a surface of the thermoelectric film,
wherein the thermoelectric film comprises a compound comprising bismuth (Bi), antimony (Sb), lead (Pb), tellurium (Te), and/or selenium (Se).

34. The device of claim 33, wherein the crystallographic orientation of the thermoelectric film is tilted at an angle in a range of about 10 degrees to about 25 degrees relative to a surface of the thermoelectric film.

35. The device of claim 33, wherein the thermoelectric film has a thickness in a range of about 5 micrometers (μm) to about 100 μm.

36. The device of claim 35, wherein the thermoelectric film has a thickness of about 40 μm or less.

37. The device of claim 33, wherein the thermoelectric film has a crack density of less than about 1 crack per millimeter (mm).

38. The device of claim 33, further comprising:

a second thermoelectric element comprising a second thermoelectric film having a crystallographic orientation that is tilted at an angle in a range of about 5 degrees to about 30 degrees relative to a surface of the second thermoelectric film, wherein the first and second thermoelectric elements have different conductivity types; and first and second headers, wherein the first and second thermoelectric elements are electrically coupled in series and are thermally coupled in parallel between the first and second headers.

39. A thermoelectric film, comprising:

a thermoelectric material layer having a thickness of less than about 100 micrometers (μm) and a crack density of less than about 1 crack per millimeter (mm) and having a crystallographic orientation that is tilted at an angle in a range of about 10 degrees to about 30 degrees relative to a surface of the thermoelectric film, wherein the thermoelectric film comprises a compound comprising bismuth (Bi), antimony (Sb), lead (Pb), tellurium (Te), and/or selenium (Se).

40. The thermoelectric film of claim 39, wherein a plane defined by the crystallographic orientation of the thermoelectric material layer is a (0015) plane.

41. The method of claim 1, wherein the growth surface of the substrate is macroscopically planar.

42. The device of claim 33, wherein the surface of the thermoelectric film comprises a macroscopically planar surface.

* * * * *

UNITED STATES PATENT AND TRADEMARK OFFICE
CERTIFICATE OF CORRECTION

| | | |
|---|---|---|
| PATENT NO. | : 7,804,019 B2 | Page 1 of 1 |
| APPLICATION NO. | : 12/024475 | |
| DATED | : September 28, 2010 | |
| INVENTOR(S) | : Pierce et al. | |

It is certified that error appears in the above-identified patent and that said Letters Patent is hereby corrected as shown below:

Column 1, Line 47: Please correct "$K_c$" to read -- $K_e$ --
    Line 51, (equation 2):
        correct "$Z=\alpha^2\sigma/(K_L+K_c)=\alpha^2/[K_L/(\mu\sigma q)+L_0)]$"
        to read -- $Z=\alpha^2\sigma/(K_L+K_e)=\alpha^2/[K_L/(\mu\rho q)+L_0 T)]$ --

Column 20, Claim 25, Line 31: correct "claim 24" to read -- claim 23 --

Signed and Sealed this
Twenty-second Day of February, 2011

David J. Kappos
*Director of the United States Patent and Trademark Office*